US008713345B2

(12) United States Patent
Sugioka

(10) Patent No.: US 8,713,345 B2
(45) Date of Patent: Apr. 29, 2014

(54) APPARATUS WITH A LOCAL TIMING CIRCUIT THAT GENERATES A MULTI-PHASE TIMING SIGNAL FOR A DIGITAL SIGNAL PROCESSING CIRCUIT

(75) Inventor: Tatsuya Sugioka, Tokyo (JP)

(73) Assignee: Sony Corporation, Tokyo (JP)

( * ) Notice: Subject to any disclaimer, the term of this patent is extended or adjusted under 35 U.S.C. 154(b) by 494 days.

(21) Appl. No.: 12/929,449

(22) Filed: Jan. 26, 2011

(65) Prior Publication Data
US 2011/0188619 A1 Aug. 4, 2011

(30) Foreign Application Priority Data

Feb. 4, 2010 (JP) ................................. 2010-022725

(51) Int. Cl.
*G06F 1/00* (2006.01)
*G06F 1/04* (2006.01)
*G06F 1/12* (2006.01)
*H03B 27/00* (2006.01)

(52) U.S. Cl.
USPC .............. 713/500; 713/501; 713/600; 331/45

(58) Field of Classification Search
None
See application file for complete search history.

(56) References Cited

U.S. PATENT DOCUMENTS

| 6,414,528 | B1 | 7/2002 | Usui | |
| 7,129,795 | B2* | 10/2006 | Okamura | 331/57 |
| 7,139,348 | B1 | 11/2006 | Fu et al. | |
| 7,496,781 | B2* | 2/2009 | Tamura et al. | 713/600 |
| 7,664,978 | B2* | 2/2010 | Burney et al. | 713/500 |
| 8,161,314 | B2* | 4/2012 | Jacobowitz et al. | 713/600 |
| 8,219,846 | B2* | 7/2012 | Feng | 713/503 |
| 2002/0171571 | A1* | 11/2002 | Panasik et al. | 341/141 |
| 2005/0097381 | A1 | 5/2005 | Tsai | |
| 2010/0033601 | A1* | 2/2010 | Matsuda et al. | 348/241 |
| 2010/0117742 | A1* | 5/2010 | Da Dalt | 331/18 |

FOREIGN PATENT DOCUMENTS

| JP | 02-296410 | 12/1990 |
| JP | 06-216705 | 8/1994 |
| JP | 08-237142 | 9/1996 |
| JP | 08-316802 | 11/1996 |
| JP | 2001-217695 A | 8/2001 |
| JP | 2002-158566 A | 5/2002 |
| JP | 2007-096903 A | 4/2007 |
| JP | 2007-215213 A | 8/2007 |
| WO | WO-2005/097381 | 10/2005 |

OTHER PUBLICATIONS

Extended European Search Report issued Apr. 11, 2011 for corresponding European Application No. 11 15 2180.
Japanese Office Action issued Feb. 4, 2014 for corresponding Japanese Application No. 2010-022725.

* cited by examiner

*Primary Examiner* — Ji H Bae
(74) *Attorney, Agent, or Firm* — Rader, Fishman & Grauer PLLC

(57) ABSTRACT

A local timing circuit receives a reference timing signal and generates a multi-phase timing signal for output to a digital signal processing circuit.

29 Claims, 16 Drawing Sheets

APPARATUS WITH A LOCAL TIMING CIRCUIT THAT GENERATES A MULTI-PHASE TIMING SIGNAL FOR A DIGITAL SIGNAL PROCESSING CIRCUIT

BACKGROUND OF THE INVENTION

1. Field of the Invention

The present invention relates to an electronic circuit, an electronic apparatus, and a digital signal processing method. More specifically, the present invention relates to locally generating and using a multi-phase timing signal.

2. Description of Related Art

Japanese Patent Laid-open No. 2007-2152130 (hereinafter, Patent Document 1) proposes a mechanism of supplying, to a digital signal processor, a multi-phase clock that is composed of plural clock signals having phases different from each other and has a low toggle frequency to thereby realize high-speed processing with suppression of the power consumption.

SUMMARY OF THE INVENTION

A local timing circuit receives a reference timing signal and generates a multi-phase timing signal for output to a digital signal processing circuit.

An example embodiment of an electronic circuit comprises a digital signal processing circuit and a local timing circuit. The local timing circuit is locally connected to the digital signal processing circuit, and is configured to receive a reference timing signal, generate a multi-phase timing signal corresponding to the reference timing signal, and output the multi-phase timing signal to the digital signal processing circuit.

The reference timing signal may comprise a phase locking pulse signal. The local timing circuit receives a control signal that controls a differential delay of respective components of the multi-phase timing signal with reference to the phase locking pulse signal.

The local timing circuit may comprise a plurality of delay elements that receive the control signal and produce the differential delay of the respective components of the multi-phase clock signal. The plurality of delay elements may be configured to match delay elements of a reference timing circuit from which the control signal is received.

The present invention can be variously embodied including as electronic circuits, electronic apparatus, processes, computer systems, and the like.

DETAILED DESCRIPTION OF THE PREFERRED EMBODIMENTS

Figure 1A:
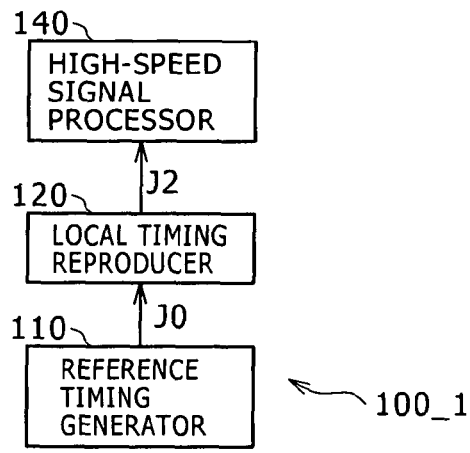
FIGS. 1A to 1E are diagrams for explaining the basic configurations of a timing generating circuit.
Figure 1B:
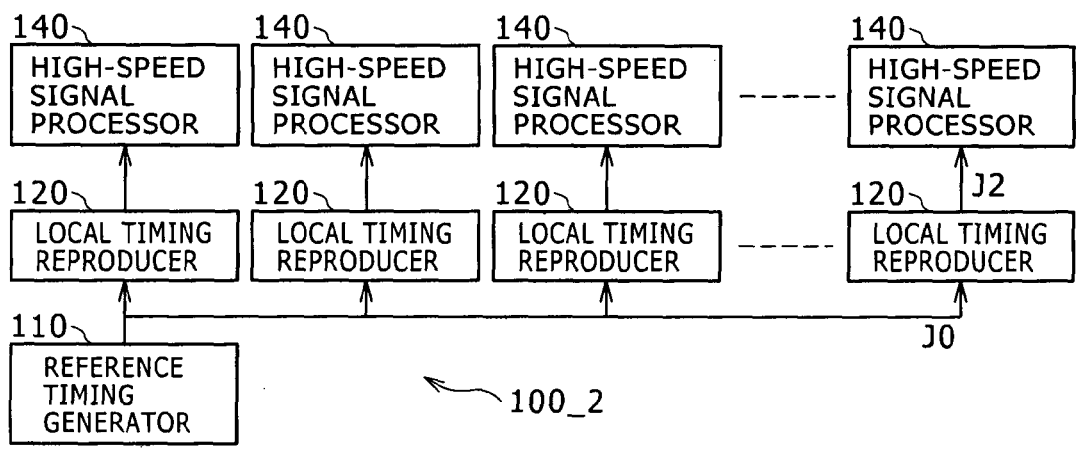

Embodiments of the present invention are described in detail below with reference to the drawings.

Initially, it is noted that the mechanism of Patent Document 1 involves the need to generate, by a multi-phase clock generator, plural clock signals as the clock signals serving as the basis of the operation in the digital signal processor and distribute the clock signals to the respective digital signal processors.

To distribute the multi-phase clock to the respective digital signal processors required to carry out high-speed operation in such a way that the respective phase relationships among the clock signals are correctly kept, implementation relating to the circuit design, the layout, and so forth becomes complex and a long time is taken by adjustment work. As a result, characteristic deterioration such as phase variation among the respective clock signals and jitter is caused and e.g. an increase in the area of the layout for clock distribution occurs. Consequently, it is difficult to achieve the effects of circuit speed enhancement and power consumption reduction.

The present invention provides a mechanism capable of distributing a multi-phase clock to the respective digital signal processors required to carry out high-speed operation in such a way that the respective phase relationships among the clock signals are correctly kept.

Example embodiments described herein allow the signal processor and the multi-phase clock generator to be disposed close to each other, and thus eliminate the need to transmit the multi-phase clock to the signal processor across a long distance.

The multi-phase clock can be transmitted to the signal processor required to carry out high-speed operation in such a way that the respective phase relationships among the clock signals are correctly kept. By supplying the multi-phase clock having a low toggle frequency to the signal processor, high-speed processing can be realized in the respective signal processors with suppression of the overall power consumption.

The order of the description is as follows.
1. Basic Configuration (first example to fifth example)
2. First Embodiment (reference timing generation by PLL, reproduction of multi-phase timing signal by ring buffer, phase alignment by PLL output, high-speed processing is parallel-serial conversion)
3. Second Embodiment (reference timing generation by PLL, reproduction of multi-phase timing signal by ring buffer, phase alignment by external reference clock, high-speed processing is parallel-serial conversion)
4. Third Embodiment (reference timing generation by PLL, reproduction of multi-phase timing signal by delay line, phase alignment by PLL output, high-speed processing is parallel-serial conversion)
5. Fourth Embodiment (reference timing generation by DLL, reproduction of multi-phase timing signal by ring buffer, phase alignment by DLL output, high-speed processing is parallel-serial conversion)
6. Fifth Embodiment (reference timing generation by PLL, reproduction of multi-phase timing signal by ring buffer, phase alignment by PLL output, high-speed processing is counter)
7. Sixth Embodiment (the number of clock lines for data hold timing is changed to one as difference from first to fourth embodiments)
8. Summarization of Operation and Effects of Respective Embodiments
9. Example of Application to Electronic Apparatus (application to solid-state imaging device)

<Basic Configuration>

FIGS. 1A to 1E are diagrams for explaining the basic configurations of a timing generating circuit as one example of an electronic circuit to which one embodiment of the present invention is applied. All of the respective basic configurations of a timing generating circuit 100 include a reference timing generator 110, a local timing reproducer 120, and a high-speed signal processor 140. The reference timing generator 110 functions as the reference timing supply unit to supply a reference timing signal J0 to the local timing reproducer 120.

In one embodiment, an electronic circuit comprises a digital signal processing circuit, and a local timing circuit that is locally connected to the digital signal processing circuit. The local timing circuit, referred to as a local timing reproducer 120 in FIGS. 1A-E, is configured to receive a reference timing signal, generate a multi-phase timing signal corresponding to the reference timing signal, and output the multi-phase timing signal to the digital signal processing circuit.

The reference timing signal comprises a phase locking pulse signal, and the local timing circuit is configured to receive a control signal that controls a differential delay of respective components of the multi-phase timing signal with reference to the phase locking pulse signal.

In one example, the reference timing signal comprises a single phase clock signal. There, the local timing circuit is configured to receive a control signal that controls a differential delay of respective components of the multi-phase timing signal with reference to the single phase clock signal.

The present invention may also be embodied as an electronic apparatus, such as a solid-state imaging devices. In this instance, the electronic apparatus comprises a digital signal processing circuit and a local timing circuit, which again is locally connected to the digital signal processing circuit. The local timing circuit is configured to receive a reference timing signal, generate a multi-phase timing signal corresponding to the reference timing signal, and output the multi-phase timing signal to the digital signal processing circuit.

Still further embodiments includes methods for generating a multi-phase timing signal. An example method includes receiving, by a timing circuit that is locally connected to a digital signal processing circuit, a reference timing signal; generating, by the timing circuit, a multi-phase timing signal corresponding to the reference timing signal; and outputting the multi-phase timing signal to the digital signal processing circuit.

A timing generating circuit 100_1 of a first basic configuration example shown in FIG. 1A includes the single high-speed signal processor 140.

The local timing circuit may be one of a plurality of local timing circuits respectively paired to a plurality of digital signal processing circuits, the plurality of local timing circuits each locally generating multi-phase timing signals for the respective plurality of digital signal processing circuits. For example, a timing generating circuit 100_2 of a second basic configuration example shown in FIG. 1B includes the plural high-speed signal processors 140. The local timing reproducer 120 is provided for each of the plural high-speed signal processors 140 with a one-to-one correspondence, and one reference timing generator 110 is provided in common to the plural local timing reproducers 120. Hereinafter, this configuration will be referred to also as "the one-to-one assignment configuration."

The entire configuration is made compact by allowing the reference timing generator 110 to be shared by the plural (in this example, all) local timing reproducers 120. As long as the reference timing generator 110 is shared by the plural local timing reproducers 120, it is not essential that the reference timing generator 110 is shared by all local timing reproducers 120, but the plural reference timing generators 110 may be included in this configuration. In this case, however, the circuit scale becomes correspondingly larger. The local timing circuit may also be one of a plurality of local timing circuits paired to a plurality of digital signal processing circuits, the plurality of local timing circuits each receiving the timing signal from a reference timing circuit, the plurality of local timing circuits each locally generating multi-phase timing signals for the respective plurality of digital signal processing circuits based upon the timing signal received from the reference timing circuit.

Figure 1C:
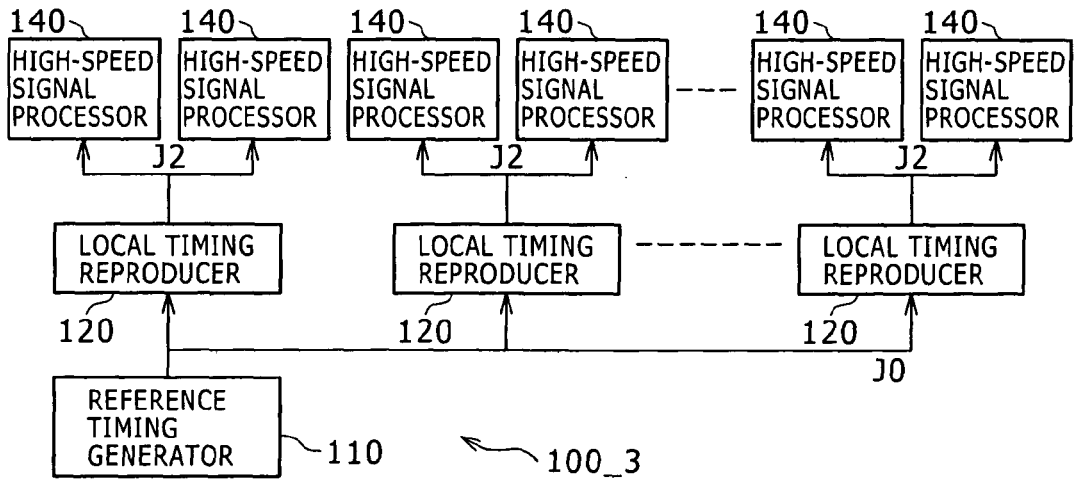

FIG. 1C illustrates an example where the timing circuit is paired to a plurality of digital signal processing circuits, and generates the multi-phase timing signal locally for the plurality of digital signal processing circuits. Specifically, a timing generating circuit 100_3 of a third basic configuration example shown in FIG. 1C is the same as the second basic configuration example in that plural (M) high-speed signal processors 140 are included, but is different from the second basic configuration example in that plural (m (M>m, m=2 in the diagram)) high-speed signal processors 140 are provided per one local timing reproducer 120. Satisfying M>m means the use of M/m local timing reproducers 120, the number of which is smaller than the total number M of high-speed signal processors 140. Hereinafter, such a configuration will be referred to also as "the one-to-m assignment configuration."

For example, each local timing reproducer 120 distributes a multi-phase timing signal J2 to m high-speed signal processors 140 near the local timing reproducer 120. The far high-speed signal processor 140 receives the distribution of the multi-phase timing signal J2 from the local timing reproducer 120 provided near this high-speed signal processor 140.

In the second basic configuration example of "the one-to-one assignment configuration," although the local timing reproducer 120 does not distribute the multi-phase timing signal J2 to the plural high-speed signal processors 140, difficulty in ensuring of the space for providing the local timing reproducer 120 for each high-speed signal processor 140 is a problem. In such a case, if the third basic configuration example is employed, satisfying M>m can solve a problem in the case in which the multi-phase timing signal J2 is distributed from one place to all of M high-speed signal processors 140 (this configuration will be referred to also as "the one-to-M assignment configuration") and can solve also the problem of the space for providing the local timing reproducers 120.

Figure 1D:
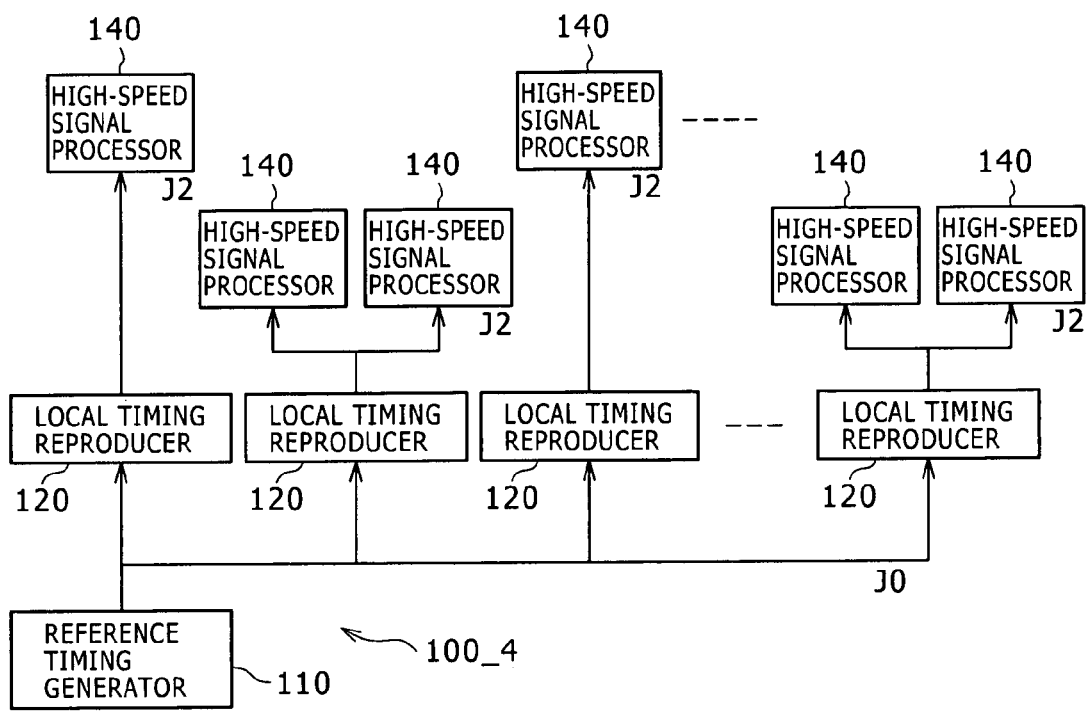
Figure 1E:
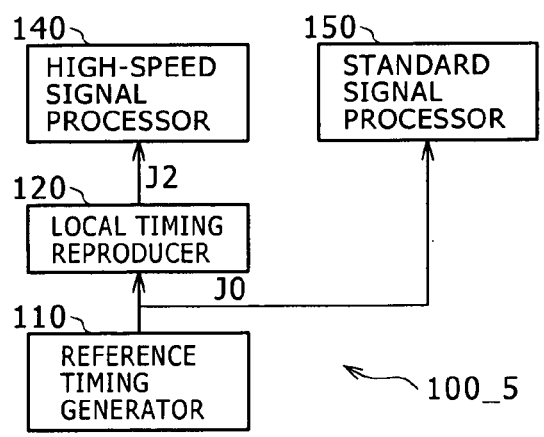

A timing generating circuit 100_4 of a fourth basic configuration example shown in FIG. 1D arises from the combination of both of the concept of the second basic configuration example of "the one-to-one assignment configuration" and the concept of the third basic configuration example of "the one-to-m assignment configuration." This configuration is suitable for the case of avoiding the problem in the distribution of the multi-phase timing signal J2 to a far place and solving the problem of the space for providing the local timing reproducers 120 by accordingly using the second basic configuration example and the third basic configuration example depending on the distance between the local timing reproducer 120 and the high-speed signal processor 140.

For example, in a place where the local timing reproducer 120 and the high-speed signal processor 140 are relatively far away from each other, the second basic configuration example of "the one-to-one assignment configuration" is employed to thereby avoid the problem in the distribution of the multi-phase timing signal J2 to the high-speed signal processors 140 at plural far places. On the other hand, in a place where the local timing reproducer 120 and the high-speed signal processor 140 are relatively close to each other, the third basic configuration example of "the one-to-m assignment configuration" is employed, which can reduce the number of local timing reproducers 120.

In some embodiments the digital signal processing circuit receives the single phase clock signal and the multi-phase clock signal, and uses the single phase clock signal for relatively low processing speed operations and the multi-phase clock signal for relatively high processing speed operations.

In other embodiments, a digital signal processing circuit receives the multi-phase clock signal, and an additional digital signal processing circuit receives the single phase clock signal, with the single phase clock signal being used by the additional digital signal processing circuit for relatively low processing speed operations and the multi-phase clock signal being used by the digital signal processing circuit for relatively high processing speed operations. For example, a timing generating circuit 100_5 of a fifth basic configuration example shown in FIG. 1E further includes a standard signal processor 150 on the basis of the timing generating circuit 100_1 of the first basic configuration example. Although not shown in the diagram, it is also possible to make a configuration further including the standard signal processor 150 on the basis of the timing generating circuits 100_2, 100_3, and 100_4 of the second to fourth basic configuration examples. Coping with even signal processing that is not required to be executed at high-speed by the provision of the local timing reproducer 120 and the high-speed signal processor 140 in association with each other (preferably, with a one-to-one correspondence) is unnecessary (excess coping). Thus, in this case, the standard signal processor 150 executes signal processing based on the reference timing signal J0 itself.

The reference timing generator 110 generates the reference timing signal J0 that is a timing signal serving as the basis of the overall system and is supplied to e.g. the local timing reproducer 120 and the standard signal processor 150. This reference timing generator 110 is disposed at a place remote from the high-speed signal processor 140. The reference timing generator 110 may be any type as long as it can generate the reference timing signal J0, and can employ various circuit configurations. For example, it is preferable that it be configured by a phase-locked loop (PLL) or a delay-locked loop (DLL).

As the reference timing signal J0 supplied from the reference timing generator 110 to the respective local timing reproducers 120, a signal whose toggle frequency is lower than the toggle frequency (frequency) of the whole of the high-speed signal processor 140 is used.

For example if the high-speed signal processor 140 outputs a signal with a high frequency, the toggle frequency of the whole of the high-speed signal processor 140 refers to the frequency of the output signal. If the operating frequency of the inside of the high-speed signal processor 140 is high irrespective of whether or not the high-speed signal processor 140 outputs a signal (the frequency of the output signal is low in some cases), the toggle frequency of the whole of the high-speed signal processor 140 refers to the operating frequency of the inside thereof.

As the reference timing signal J0, the control voltage of a voltage controlled oscillator (VCO) and the control current of a current controlled oscillator (CCO) can be utilized. Furthermore, e.g. a comparatively-low-speed output clock output from a PLL, a DLL, or another oscillator circuit or a reference clock input from the external to a PLL, a DLL, or another oscillator circuit can be utilized.

It will also be possible to use only a reference clock input from the external as the reference timing signal J0. In this case, in an actual condition, the reference timing generator 110 is unnecessary and lines for supplying the reference timing signal J0 to the local timing reproducers 120 at the respective places serve as the reference timing supply unit.

From the viewpoint of the local timing reproducer 120, the reference timing signal J0 corresponds to e.g. oscillation control information and delay amount control information that are necessary for generation of the multi-phase timing signal J2 by the local timing reproducer 120 and timing information for phase alignment of the multi-phase timing signal J2 (pulse for synchronization: locking pulse). As the oscillation control information and the delay amount control information, a signal of a voltage or a current is used. As the locking pulse, a pulse signal whose toggle frequency is lower than that of the signal used in the high-speed signal processor 140 is used.

In the present embodiment, as the reference timing signal J0, any one or all of these signals can be used. That is, various kinds of reference timing signals J0 can be arbitrarily combined and used. In this case, at least the oscillator circuit of the reference timing generator 110 and the circuit of the local timing reproducer 120 share the control voltage or the control current. If there is no variation in the device characteristics used by both circuits, the frequencies of the pulse signals output from these two circuits can be equalized to each other through the sharing of the control voltage or the control current.

However, if the device characteristics involve variation, possibly the frequencies of the pulse signals output from these two circuits cannot be equalized to each other even when the control voltage or the control current is shared. As a countermeasure thereagainst, it is preferable to supply, to the local timing reproducer 120, also the timing signal (locking pulse) for phase alignment in addition to the control voltage or the control current.

The local timing reproducer 120 is disposed near the high-speed signal processor 140 and reproduces (generates) the multi-phase timing signal J2 necessary for the high-speed signal processor 140 based on the reference timing signal J0 from the reference timing generator 110. The local timing reproducer 120 is one example of the multi-phase clock generator to generate the multi-phase timing signal J2 (multi-phase clock) composed of plural clock signals having phases different from each other.

The local timing reproducer 120 may be any type as long as it can generate the multi-phase timing signal J2, and can employ various circuit configurations. For example, it is preferable that it be configured by an oscillator circuit based on a ring buffer or a delay line based on a buffer chain whose delay is controlled. In both of the cases of using a ring buffer and using a delay line, it is preferable to allow reception of supply of the timing signal (locking pulse) for phase alignment so that the frequencies of the pulse signals output from the respective circuits can be made equal to each other through sharing of the control voltage or the control current even when there is a variation in the respective device characteristics between an oscillator 210 of the reference timing generator 110 and the local timing reproducer 120.

The multi-phase timing signal J2 supplied from the local timing reproducer 120 to the high-speed signal processor 140 is timing information serving as the basis for executing high-speed processing in the high-speed signal processor 140. However, the respective timing signals forming the multi-phase timing signal J2 are signals whose toggle frequency is lower than that of the signal used in the high-speed signal processor 140. More specifically, the multi-phase timing signal J2 has plural clock phases due to the combination of plural clock signals. In other words, the multi-phase timing signal J2 is such a signal that, although the frequencies of the individual clock signals are low, the timing information that is high speed as a whole can be supplied to the high-speed signal processor 140 through the combination of the phases of the respective clock signals. This multi-phase timing signal J2 is composed of plural clock signals having the phase relationship necessary for the high-speed signal processor 140, and typically composed of plural clock signals having phases different from each other at equal intervals.

The local timing reproducer 120 generates the multi-phase timing signal J2 based on the reference timing signal J0. Thereby, accurate, high-speed timing information can be generated, and the toggle frequency of the respective timing signals can be set lower than that of the signal used in the high-speed signal processor 140. Thus, the power consumption can be reduced and the maximum operating frequency can be enhanced.

The high-speed signal processor 140 is a functional block or a circuit unit to realize functions that are required to execute high-speed processing. The high-speed signal processor 140 corresponds to e.g. a high-speed parallel-serial conversion circuit, a high-speed serial-parallel conversion circuit, a counter circuit, or a calculating circuit used in a central processing unit (CPU) or the like.

The standard signal processor 150 is a circuit unit that operates based on the reference timing signal J0 from the reference timing generator 110 and is one example of the low-speed signal processor to execute digital signal processing at speed lower than the speed of the high-speed signal processor 140. In other words, the standard signal processor 150 is a functional block or a circuit unit to realize functions that are required to execute processing of not high speed but standard speed.

In the timing generating circuit 100 having such a configuration, the reference timing generator 110 is disposed at a position remote from the high-speed signal processor 140, whereas the local timing reproducer 120 is disposed near the high-speed signal processor 140.

Furthermore, first the reference timing signal J0, whose toggle frequency is lower than the toggle frequency (frequency) of the signal used in the high-speed signal processor 140, is sent from the reference timing generator 110 to the local timing reproducer 120. Based on this reference timing signal J0, the multi-phase timing signal J2 serving as the basis of high-speed processing in the high-speed signal processor 140 is generated by the local timing reproducer 120.

By supplying this multi-phase timing signal J2 having a low toggle frequency to the high-speed signal processor 140, the power consumption can be suppressed and higher-speed processing can be realized compared with the case in which the reference timing signal having the same toggle frequency as that of the signal used in the high-speed signal processor 140 is supplied from the reference timing generator 110 to the high-speed signal processor 140.

For example, when enhancement of the circuit operation speed and reduction in the power consumption are desired, it will be possible that the multi-phase timing signal J2 having phases different from each other at equal intervals is generated as the clock signal serving as the basis of high-speed operation by the reference timing generator 110 and the high-speed signal processor 140 disposed at a comparatively-remote position uses the multi-phase timing signal J2. This makes it possible to achieve power consumption reduction by lowering the toggle frequency of the circuit and obtain a high-speed timing reference by combining the respective edges of the multi-phase clock signal.

However, in this case, to generate the multi-phase clock by the reference timing generator 110 and distribute the multi-phase clock to the high-speed signal processor 140 required to carry out high-speed operation in such a way that the respective phase relationships are correctly kept, implementation relating to the circuit design, the circuit arrangement (layout), and so forth becomes complex. Therefore, a long time is taken by adjustment work. As a result, disadvantages are caused such as characteristic deterioration (phase variation, jitter, etc.) of the multi-phase clock signal and an increase in the area of the layout for clock distribution. Therefore, it becomes difficult to achieve the effects of circuit speed enhancement and power consumption reduction.

In particular, in the case of providing the plural high-speed signal processors 140, generally it is difficult to dispose the reference timing generator 110 and all high-speed signal processors 140 within short distances, and thus the problems thereof become more obvious.

Even when the number of high-speed signal processors 140 is one, the reference timing generator 110 cannot necessarily be disposed near the high-speed signal processor 140 because of the limit to the layout. Furthermore, in some cases, the reference timing generator 110 generates not only the multi-phase timing signal J2 for the high-speed signal processor 140 but also a reference timing signal used by another functional block and circuit unit (e.g. standard signal processor 150). In this case, it is difficult to achieve the effects of circuit speed enhancement and power consumption reduction because of disadvantages such as characteristic deterioration of the multi-phase clock signal and an increase in the area of the layout for clock distribution.

In contrast, in the mechanism of the embodiments, the multi-phase timing signal J2 is not distributed to the respective high-speed signal processors 140. Instead, the reference timing generator 110 distributes frequency and phase information serving as the basis to the local timing reproducer 120 disposed near the respective high-speed signal processors 140, and the multi-phase timing signal J2 is locally reproduced and supplied with high accuracy near the respective high-speed signal processors 140 desired to realize high-speed functional processing with low power consumption. This eliminates the disadvantages such as characteristic deterioration of the multi-phase clock signal and an increase in the area of the layout for clock distribution, and allows achievement of the effects of circuit speed enhancement and power consumption reduction.

Specific mechanisms will be described below. In the following description, when a functional element is discriminated based on the kind of embodiment, a reference index by a capital alphabet is given to this functional element. When a functional element is not particularly discriminated, the giving of this reference index is omitted. This applies also to the drawings.

First Embodiment

[Entire Configuration]

Figure 2:
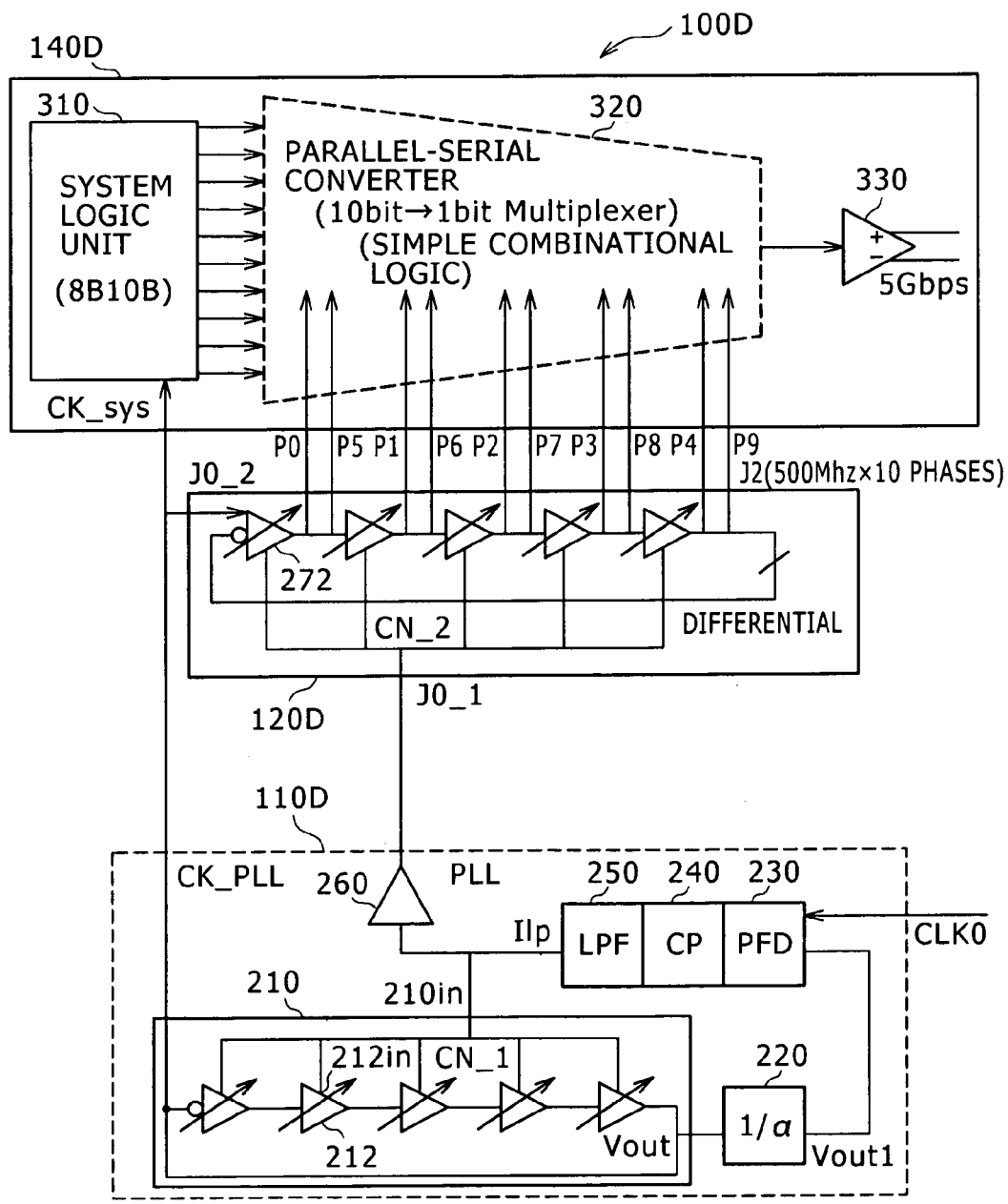
FIG. 2 is a diagram for explaining a timing generating circuit according to a first embodiment of the present invention.

FIG. 2 is a diagram for explaining a timing generating circuit 100 according to a first embodiment of the present invention. FIG. 2 is an example wherein the phase locking pulse signal is a clock output of the phase locked loop circuit, the local timing circuit comprises a ring buffer that includes the plurality of delay elements, and the control signal is a voltage or current control signal that is based upon a voltage or current control signal of the phase locked loop circuit.

First, a timing generating circuit 100D of the first embodiment utilizes a unit having a configuration based on a PLL as a reference timing generator 110D.

The reference timing generator 110D of the first embodiment includes an oscillator 210 (OSC), a frequency divider 220, a phase frequency detector 230 (PFD), a charge pump unit 240 (CP), a loop filter unit 250, and a buffer unit 260.

As the oscillator 210, either a voltage control oscillator circuit (VCO) or a current control oscillator circuit (current control oscillator (CCO)) may be employed. The following description is based on the assumption that a current control oscillator circuit is employed unless a particular note is made.

The oscillator 210 configured by a current control oscillator circuit uses an oscillator circuit based on a ring buffer made by cascading plural stages of oscillator constituent elements into a ring structure. Specifically, unit delay elements 212 (referred to also as delay cell and delay stage) are used as the oscillator constituent elements, and they are cascaded. In this configuration, as one example, five unit delay elements 212 are used and a buffer circuit is used as the unit delay element 212. When the unit delay element 212 of the α-th stage is discriminated, a reference index α is given to this unit delay element 212. This applies also to other unit delay elements to be described later.

The oscillator 210 serves as a negative feedback part as the connection and, in operation, serves as a positive feedback part due to phase shift attributed to the internal RC component (resistive component and capacitive component) so that a differential ring oscillator may be configured as a whole. For example, the respective unit delay elements 212 are cascaded and the output signal of the unit delay element 212 of the final stage is returned to the input of the unit delay element 212 of the first stage. Differential clock signals (500 Mhz) are output from the respective unit delay elements 212 of the oscillator 210 of the reference timing generator 110D, and these signals are supplied to the unit delay elements 212 of the subsequent stages. To clarify that "the oscillator 210 serves as a negative feedback part as the connection," a symbol of "inverting input" is given to the input of the unit delay element 212 of any stage (first stage, as one example).

Each unit delay element 212 (buffer circuit) may be any type as long as it is an element having a configuration allowing delay control. For example, it can be configured by a differential circuit made by using two transistors (e.g. field effect transistors). Although not shown in the drawing, for example, the gate G of one transistor is used as a non-inverting input (Vin+), and the drain D thereof is connected to a power supply Vdd via a resistive element and used as an inverting output (Vout−). Furthermore, the gate G of the other transistor is used as an inverting input (Vin−), and the drain D thereof is connected to the power supply Vdd via a resistive element and used as a non-inverting output (Vout+). In addition, the sources S of the respective transistors are connected in common and connected to a reference potential (e.g. ground potential GND) via a current source of a current value variable type.

The current source of the current value variable type receives an oscillation control signal CN_1 (=loop filter output current Ilp) supplied to a control input terminal 212in in the current mirror form (the current mirror ratio may be one to one) and supplies a bias current to the transistors. By controlling the bias current of the differential circuit by the current source of the current value variable type, the amount of delay of each unit delay element 212 is controlled and the oscillation frequency as a whole is controlled.

The control input terminals 212 in of the respective unit delay elements 212 are connected to a frequency control input terminal 210in in common. The loop filter output current Ilp supplied to the respective control input terminals 212 in via the frequency control input terminal 210 in is used as the oscillation control signal CN_1. The oscillation control signal CN_1 is an oscillation control current Icnt in the case of a current control oscillator circuit, and is an oscillation control voltage Vcnt in the case of a voltage control oscillator circuit.

The frequency divider 220 is provided according to need (in the case of realizing a frequency multiplication function between the reference timing generator 110D and a local timing reproducer 120D), and divides the oscillation frequency fcco of an output oscillation signal Vout output from the output terminal of the oscillator 210 into 1/α to acquire a frequency-divided oscillation signal Vout1. α is the PLL frequency multiplication factor (referred to also as the frequency division ratio) and is a positive integer equal to or larger than one. In addition, it is preferable that α be variable so that the frequency of a PLL output clock CK_PLL can be changed.

In terms of comparison with a fourth embodiment of the present invention to be described later, because the reference timing generator 110D has a PLL configuration, there is an advantage that the frequency multiplication function can be realized by the provision of the frequency divider 220 having a simple configuration and thus the circuit scale can be set smaller.

The phase frequency detector 230 compares the phase and frequency of a reference clock supplied from the external and the output oscillation signal Vout from the oscillator 210 or the frequency-divided oscillation signal Vout1 from the frequency divider 220 (the following description will employ the frequency-divided oscillation signal Vout1 unless a note is made). The phase frequency detector 230 outputs, as a comparison result signal Vcomp, an error signal indicating the phase difference and the frequency difference as the comparison result. The reference clock supplied from the external to one input terminal of the phase frequency detector 230 will be referred to as the external reference clock CLK0, and the other signal supplied to the other input terminal of the phase frequency detector 230 is the frequency-divided oscillation signal Vout1 unless a note is made.

The charge pump unit 240 allows input and output of a drive current (referred to as the charge pump current Icp) dependent on the comparison result signal Vcomp output from the phase frequency detector 230. For example, the charge pump unit 240 includes a charge pump that allows input and output of the charge pump current Icp output from the phase frequency detector 230 and a current source of a current value variable type to supply a bias current Icpbias to the charge pump.

The loop filter unit 250 is one example of the smoother to smooth the comparison signal output from the phase frequency detector 230 via the charge pump unit 240. The loop filter unit 250 is e.g. a low-pass filter and integrates the charge pump current Icp generated by the charge pump unit 240 to generate the loop filter output current Ilp for controlling the oscillation frequency fcco of the oscillator 210. The loop filter output current Ilp is used as the oscillation control signal CN_1 of the oscillator 210 and is used also as an oscillation control signal CN_2 of the local timing reproducer 120.

The loop filter unit 250 has a configuration compatible with current output so as to match the oscillator 210 configured by a current control oscillator circuit. Although not shown in the diagram, specifically, the loop filter unit 250 has a capacitor (capacitive element) having a loop filter capacitance Cp and a voltage-current converter (transconductance) having a voltage-current conversion gain Gm.

The output of the charge pump is connected to one terminal of the capacitor and the input of the voltage-current converter in common. The other terminal of the capacitor is connected to the ground (GND) as the reference potential. If the reference timing generator 110D of a PLL configuration is configured by an IC (semiconductor integrated circuit), the capacitor is connected in the external of the IC in some cases, and the gate capacitance of a MOS transistor TR is used as the capacitor in other cases.

In the loop filter unit 250, a voltage signal (referred to as the charge pump voltage Vcp) is generated at one terminal of the capacitor (i.e. the input of the voltage-current converter) based on the charge pump current Icp output from the charge pump.

Because this operation is the charge/discharge operation of the capacitor, the loop filter unit 250 functions as a low-pass filter that assumes at least one cut-off frequency so as to attenuate frequency components equal to or higher than a predetermined cut-off frequency (referred to also as the roll-off frequency and the pole) in the comparison result signal Vcomp from the phase frequency detector 230 and smooth the oscillation control current Icnt supplied to the oscillator 210.

The function as the low-pass filter may be enhanced by connecting in series not only the capacitor but also a resistive element having a loop filter resistance Rp. In the case of employing a configuration including one charge pump, normally a configuration including this resistive element is employed.

Based on the charge pump current Icp output from the charge pump, the voltage-current converter converts the charge pump voltage Vcp generated at one terminal of the capacitor (i.e. the input of the voltage-current converter) to a current signal (loop filter output current Ilp) in accordance with the voltage-current conversion gain Gm.

The buffer unit 260 serves as the interface between the loop filter unit 250 and the local timing reproducer 120D and is provided according to need. For example it is configured by a current-current conversion circuit that functions as a current buffer. The current-current conversion circuit has a function to convert the loop filter output current Ilp from the loop filter unit 250 to K times (K is the current mirror ratio and may be any of values including one, and it may be either larger or smaller than one).

In the reference timing generator 110D having such a configuration, the output voltage Vcomp of the phase frequency detector 230, which is phase error information, is converted to the oscillation control current Icnt via the charge pump unit 240 and the loop filter unit 250 to be supplied to the oscillator 210. Furthermore, the oscillation frequency (=Oscillation frequency fcco) of the output oscillation signal Vout output from the oscillator 210 is controlled, and the phase thereof is locked with the digital data row of the PLL output clock CK_PLL as the output oscillation signal Vout. In this configuration, a pulse signal (PLL output clock CK_PLL) of 500 Mhz locked with the external reference clock CLK0 is output. This PLL output clock CK_PLL is used as a phase locking pulse J0_2 to the local timing reproducer 120D, and is used also as a system clock CK_sys to the high-speed signal processor 140.

The local timing reproducer 120D of the first embodiment is configured by an oscillator circuit based on a ring buffer made by using unit delay elements 272 similarly to the oscillator 210 included in the reference timing generator 110D. The local timing reproducer 120D is a circuit to which the edge of the phase locking pulse J0_2 can be input. That is, the local timing reproducer 120D uses an oscillator circuit (referred to as the local oscillator) based on a ring buffer including a circuit that has a loop configuration and allows input of the reference phase edge thereto.

It is preferable to use exactly the same element as the unit delay element 212 in the reference timing generator 110D and the unit delay element 272 in the local timing reproducer 120D, and it is preferable that no circuit modification exist between both elements. Therefore, in the present embodiment, although a circuit that allows edge input thereto is employed also as the unit delay element 212 in the reference timing generator 110D, it is preferable that this edge input be not used.

The unit delay element 272 may be any type as long as it is an element having a configuration allowing delay control similarly to the unit delay element 212. In this configuration, five unit delay elements 272 are used, and a buffer circuit is used as the unit delay element 272 as one example although detailed description thereof is omitted. Differential multi-phase timing signals J2 (clock signals P0 to P9 of 500 Mhz) are output from the respective unit delay elements 272 of the local timing reproducer 120D, and these signals are supplied to the unit delay elements 272 of the subsequent stages and supplied also to the high-speed signal processor 140D as described later.

As the reference timing signal J0 supplied from the reference timing generator 110D having a PLL configuration to the local timing reproducer 120D, the oscillation control current J0_1 to decide the oscillation frequency and the PLL output clock CK_PLL of 500 Mhz having the roll of the phase locking pulse J0_2 are used.

The local timing reproducer 120D is so controlled by the oscillation control current J0_1 that the oscillation frequency thereof corresponds with the frequency equal to "frequency of external reference clock CLK0×PLL frequency multiplication factor (α)," i.e. 500 Mhz equal to the frequency of the PLL output clock CK_PLL. In addition, the edge of the PLL output clock CK_PLL is input as the phase locking pulse J0_2 to the local timing reproducer 120D. Thereby, the local timing reproducer 120D is so controlled that the phase thereof corresponds with the phase of the PLL output clock CK_PLL.

The oscillator 210 of the reference timing generator 110D and the local timing reproducer 120D are controlled by a common oscillation control signal substantially. Furthermore, phase alignment is carried out by supplying the PLL output clock CK_PLL as the phase locking pulse J0_2 to the local timing reproducer 120. Thus, even when the device characteristics involve variation, the frequencies of both can be made to correspond with each other without a correction circuit or the like.

Because the local timing reproducer 120D has a loop configuration, random noise occurring in the respective unit delay elements 272 is accumulated to appear as comparatively-large phase noise. However, in the present embodiment, the phase locking pulse J0_2 is supplied to the local timing reproducer 120. Due to this feature, even the local timing reproducer 120 having a loop configuration can reduce the accumulation of phase noise due to the loop, and can reproduce the accurate multi-phase timing signal J2.

In this configuration, as the circuit element to input the edge of the phase locking pulse J0_2 to the local timing reproducer 120D, a circuit that logically switches the edge, such as a NAND circuit or a selector circuit, or a circuit that adds edges in an analog manner to make an intermediate edge, such as an adder circuit configured by an amplifier circuit or a mixer circuit, is used.

As the high-speed signal processor 140D that is disposed near the local timing reproducer 120D and required to execute high-speed processing, a simple combinational logic circuit will be employed. For example a parallel-serial conversion circuit to convert parallel bit data to one-bit serial data is used as the high-speed signal processor 140D.

For example, the high-speed signal processor 140D includes a system logic unit 310, a parallel-serial converter 320, and an output buffer 330.

The system logic unit 310 has e.g. an encoder circuit (8B10B encoder) that converts eight-bit parallel data to ten-bit parallel data based on the system clock CK_sys from the reference timing generator 110.

The parallel-serial converter 320 is e.g. a unit applied to a high-speed data transmitting circuit of 5 Gbps, and has a function to convert ten-bit parallel data to one-bit serial data.

The output buffer 330 supplies, to the subsequent-stage circuit, the serial data resulting from parallel-serial conversion by the parallel-serial converter 320 by a differential signal. For example, it will be possible to employ a configuration in which buffer elements the number of which corresponds to the number of bits are provided and the buffer elements are switched by a select signal based on a multi-phase clock. Specifically, the buffer elements (in this case, ten elements) are disposed at the previous stage of a switch unit 420 and at the subsequent stage of a data holder 410.

From the local timing reproducer 120D (the respective unit delay elements 272 therein), five pairs (ten) of differential multi-phase clock signals (ten-phase clock signals P0 to P9 of 500 Mhz) are supplied as the multi-phase timing signal J2 to the high-speed signal processor 140D, which is a parallel-serial conversion circuit. For example, the P0-phase and P5-phase clock signals are output from the unit delay element 272_1 of the first stage. The P1-phase and P6-phase clock signals are output from the unit delay element 272_2 of the second stage. The P2-phase and P7-phase clock signals are output from the unit delay element 272_3 of the third stage. The P3-phase and P8-phase clock signals are output from the unit delay element 272_4 of the fourth stage. The P4-phase and P9-phase clock signals are output from the unit delay element 272_5 of the fifth stage.

The local timing circuit thus comprises a plurality of delay elements that receive the control signal and produce the differential delay of the respective components of the multi-phase clock signal. The plurality of delay elements may also be configured to match delay elements of the reference timing circuit from which the control signal is received.

[Detailed Configuration of High-Speed Signal Processor]

Figure 3:
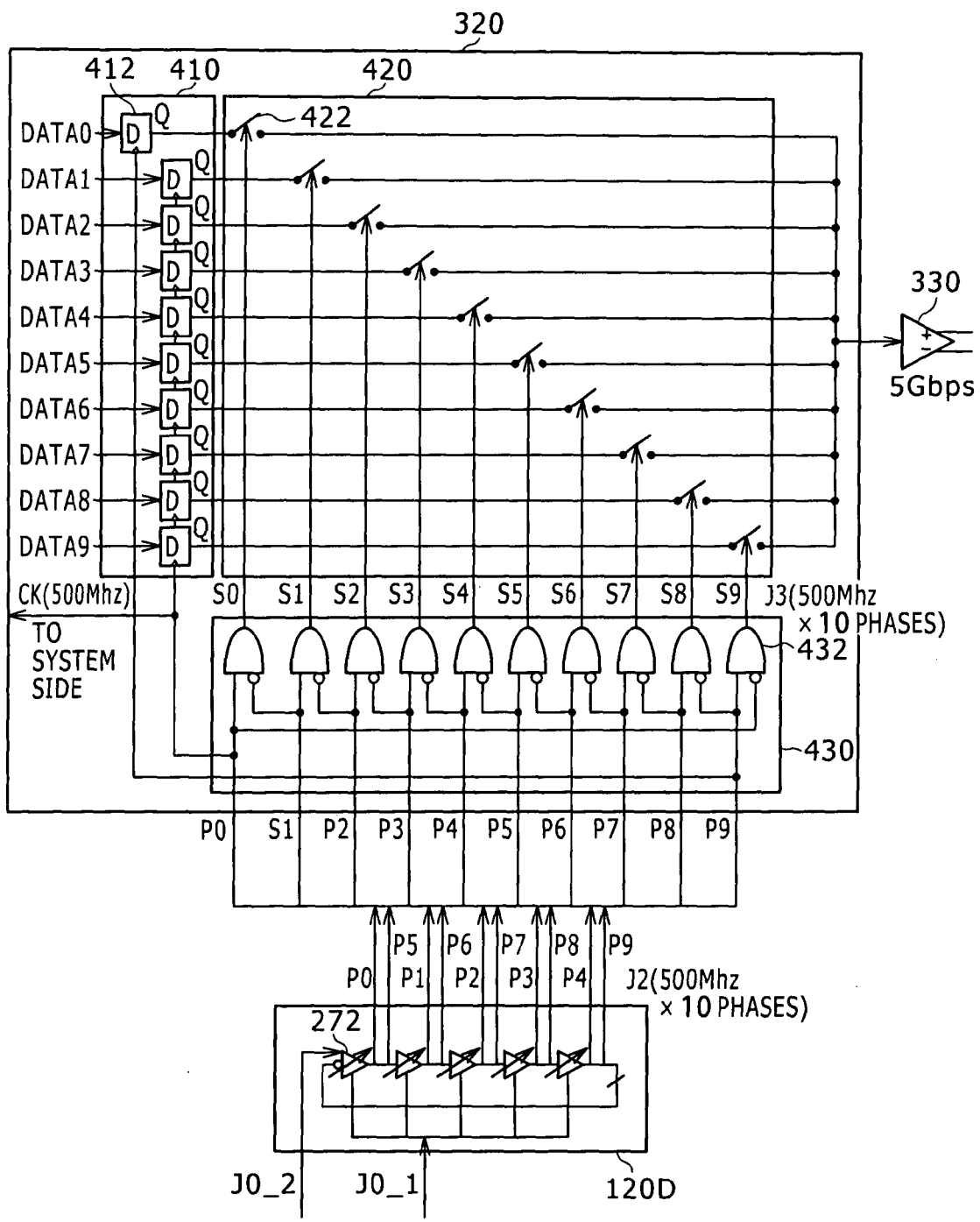
FIG. 3 is a diagram for explaining a configuration example of a high-speed signal processor of the first embodiment.

FIG. 3 is a diagram for explaining a configuration example of the high-speed signal processor 140D of the first embodiment. The following description will be made about a configuration example including the parallel-serial converter 320 required to carry out high-speed, low-power-consumption operation as described above.

The parallel-serial converter 320 of the high-speed signal processor 140D includes the data holder 410, the switch unit 420, and a decode unit 430. The data holder 410 includes plural D flip-flops 412 to hold data. The switch unit 420 includes switch elements 422 that are each provided corresponding to a respective one of the flip-flops 412 and sequentially select the output of the flip-flop 412 exclusively. The decode unit 430 controls the on/off-operation of the respective switch elements 422. The flip-flop 412 and the switch element 422 are provided for each of ten-bit parallel data. When the flip-flop 412 and the switch element 422 for the α-th bit are discriminated, a reference index α is given to them. This applies also to other flip-flops and switch elements to be described later.

Each flip-flop 412 captures and holds input data in synchronization with the rising edge of a clock signal supplied to the clock input terminal. For this operation, it will be effective to allow all flip-flops 412 to share the line of the timing signal to decide the timing of holding of the data input to the flip-flop 412 (data hold timing) to thereby decrease the number of routed lines of the timing signal. However, possibly this scheme causes a problem of a timing error (details thereof will be described later).

To avoid this problem, in the first embodiment, to the flip-flop 412 for the bit selected first, the clock signal that defines a selection signal S to control the on-timing of the switch element 422 selected last is supplied as the pulse that defines the data hold timing. To the flip-flops 412 for the remaining bits, the clock signal that defines the selection signal to control the on-timing of the switch element 422 selected first is supplied in common as the pulse that defines the data hold timing.

In the example of FIG. 3, out of ten bits, the zero-th bit is selected first and the ninth bit is selected last. Therefore, the P9-phase clock signal is supplied to the clock input terminal of the flip-flop 412_0 for the zero-th bit, to which DATA0 of the ten-bit data is input. Furthermore, the P0-phase clock signal is supplied in common to the clock input terminals of the flip-flops 412_1 to 412_9 for the remaining first to ninth bits, to which DATA1 to DATA9 are input.

The decode unit 430 is one example of the selection signal generator that generates a parallel circuit selection signal J3 (selection signals S0 to S9) to control the on-timing of the respective switch elements 422 based on the multi-phase timing signal J2 (clock signals P0 to P9) supplied from the local timing reproducer 120D. The decode unit 430 has the same number of gate circuits 432 (in this configuration, composite gate made by combining an AND gate and an inverter) as the number of phases of the multi-phase timing signal J2 (in this configuration, ten). The inverter for logic inversion of the P@-phase clock signal supplied to the other input terminal of the AND gate is represented by giving a white-circle mark to the other input terminal of the AND gate in FIG. 3.

The decode unit 430 receives the multi-phase timing signal J2 (ten-phase clock signal of 500 Mhz) from the local timing reproducer 120D, and generates the parallel circuit selection signal J3 (ten-phase selection signals S0 to S9) by the respective gate circuits 432 to supply it to the control input terminal of the corresponding switch element 422.

Specifically, in the gate circuit 432_0 for the zero-th bit, the P0-phase clock signal is supplied to one input terminal and the clock signal resulting from logic inversion of the P1-phase clock signal by the inverter is supplied to the other input terminal, so that the selection signal S0 is generated. In the gate circuit 432_1 for the first bit, the P1-phase clock signal is supplied to one input terminal and the clock signal resulting from logic inversion of the P2-phase clock signal by the inverter is supplied to the other input terminal, so that the selection signal S1 is generated.

Similarly, in the gate circuit 432_n for the n-th bit, the Pn-phase clock signal is supplied to one input terminal and the clock signal resulting from logic inversion of the Pn+1-phase clock signal by the inverter is supplied to the other input terminal, so that the selection signal Sn is generated. In the gate circuit 432_9 for the ninth bit, the P9-phase clock signal is supplied to one input terminal and the clock signal resulting from logic inversion of the P0-phase clock signal by the inverter is supplied to the other input terminal, so that the selection signal S9 is generated.

The switch element 422_n is turned on when the selection signal from the corresponding gate circuit 432_n is at the H-level, to thereby select data output from a non-inverting output terminal Q of the corresponding flip-flop 412_n and supply the data to the output buffer 330.

The parallel-serial converter 320 of the high-speed signal processor 140D having such a configuration receives the multi-phase timing signal J2 from the local timing reproducer 120D, and generates the parallel circuit selection signals S0 to S9 by the decode unit 430. Thereby, the parallel-serial converter 320 sequentially selects one-bit data from the flip-flops 4120 to 4129 holding ten-bit parallel data, to thereby realize a high-speed parallel-serial conversion function. The serial data obtained by the parallel-serial conversion is output via the output buffer 330 by a differential signal.

[Operation]

Figure 4:
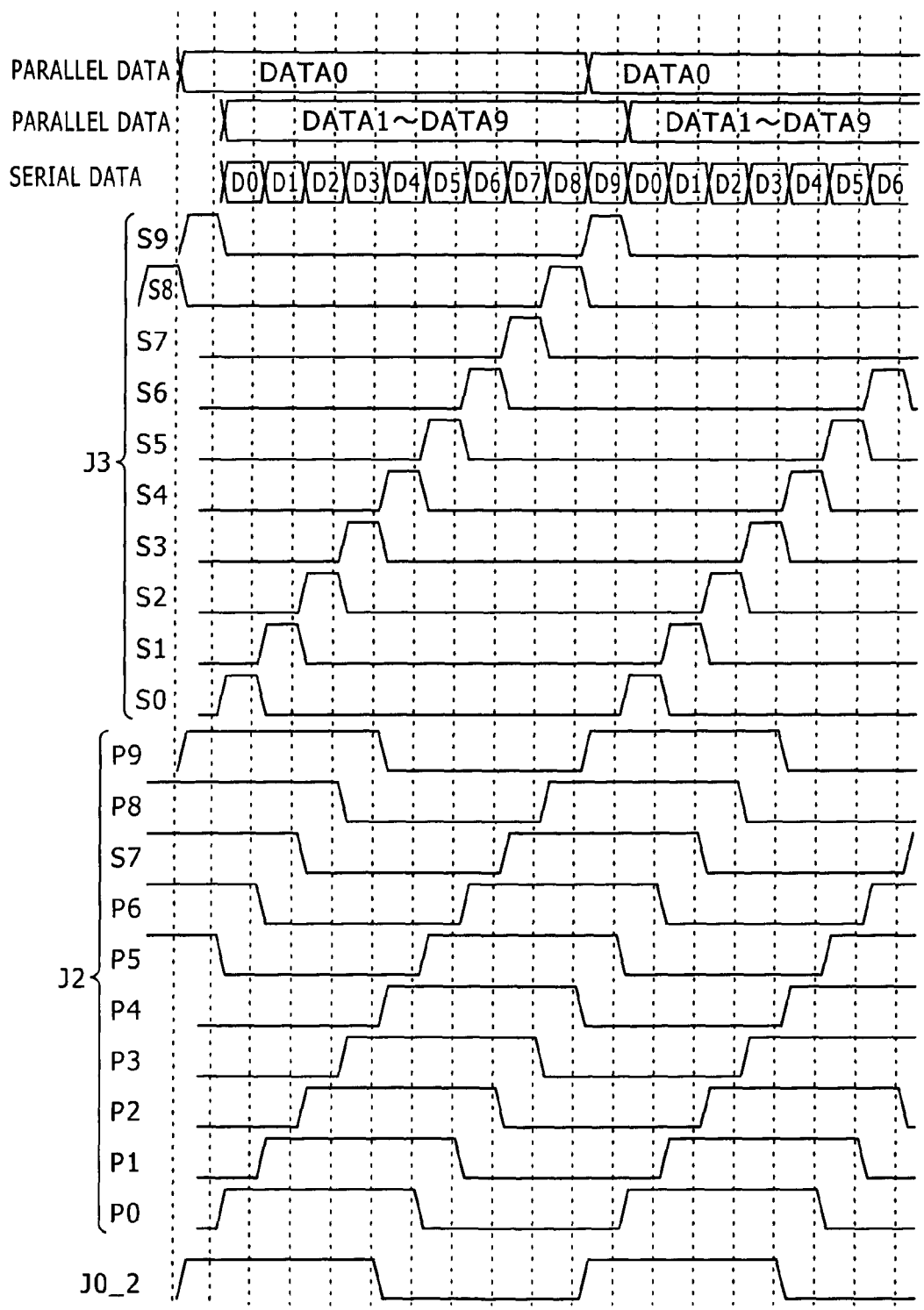
FIG. 4 is a timing chart for explaining the operation of the timing generating circuit of the first embodiment.

FIG. 4 is a timing chart for explaining the operation of the timing generating circuit 100D of the first embodiment.

On the lowermost row in FIG. 4, the state of the phase locking pulse J0_2 (=PLL output clock CK_PLL) of 500 Mhz supplied to the local timing reproducer 120D is shown. On the next upper rows, the states of the respective clock signals P0 to P9 as the multi-phase timing signal J2 output from the local timing reproducer 120D are shown. By the periodic input of the edge of the phase locking pulse J0_2 to the local timing reproducer 120D (the unit delay element 272 of the first stage therein), the phases among the respective clock signals P0 to P9 are precisely controlled at equal intervals by the oscillation control current J0_1 and the phase locking pulse J0_2, and phase noise accumulated in the loop of the local timing reproducer 120D can be reduced.

In terms of comparison with a second embodiment of the present invention to be described later, the PLL output clock CK_PLL output from the reference timing generator 110D in synchronization with the external reference clock CLK0 is used as the phase locking pulse J0_2, which provides a configuration in which the influence of phase noise of the external reference clock CLK0 is alleviated by the PLL operation. Thus, the effect to reduce the phase noise originating from the external reference clock CLK0 is higher than that in the second embodiment. However, phase jitter due to the loop as the whole of the PLL has an influence on the phase locking pulse J0_2.

On middle rows in FIG. 4, the states of the respective selection signals S0 to S9 as the parallel circuit selection signal J3 generated in the decode unit 430 of the high-speed signal processor 140D by use of the multi-phase timing signal J2 (clock signals P0 to P9) are shown. Similarly to the multi-phase timing signal J2 (clock signals P0 to P9), phase noise can be reduced also for the phases among the respective selection signals S0 to S9.

On upper rows in FIG. 4, the states of the ten-bit parallel data DATA0 to DATA9 supplied from the system logic unit 310 to the parallel-serial converter 320 and the serial data output from the parallel-serial converter 320 via the output buffer 330 are shown.

As shown in FIG. 3, the ten-bit parallel data DATA0 to DATA9 are temporarily held by the flip-flops 412_0 to 412_9 of the corresponding bit. As one example, it will be possible to hold bit data by all flip-flops 412_0 to 412_9 by using the rising edge of one of the clock signals P0 to P9 (clock signal P0). Basically, if the held ten-bit data are sequentially selected and output by the parallel circuit selection signal J3 (selection signals S0 to S9) generated by the decode unit 430, operation of parallel-serial conversion from ten bits to one bit can be realized.

However, if the clock signal P0 is used as the timing signal to decide the data hold timing in common to all flip-flops 412, the transition timing of the parallel data input to the respective switch elements 422 is almost the same as the timing of the rising edge of the timing signal P0. Therefore, if the held data DATA0 is selected and output by the selection signal S0 made from the rising edge of the clock signal P0, there is a fear that a timing error in which the held data DATA0 is selected before being sufficiently determined occurs and the serial data cannot be accurately output.

To avoid this problem, in the first embodiment, not the clock signal P0 but the clock signal P9 of the previous phase is used as the clock for holding of the bit data DATA0 of the zero-th bit by the flip-flop 412_0. This provides such timing design that the bit data DATA0 of the zero-th bit can be selected by the selection signal S0 surely. It will also be possible to sequentially use the clock signal P@-1 as the clock for data holding by the flip-flop 412_@ with a similar relationship kept also for the first to ninth bits. However, in this case, the number of routed lines of the timing signal is large. Therefore, the clock signal P0 is used in common for the first to ninth bits to thereby achieve two as the number of lines of the timing signal.

The phase relationship between the clock signal P0 and the clock signal P9 is controlled by the oscillation control current J0_1 and the phase locking pulse J0_2, and thus can be ensured even against variation among devices and change in the temperature and voltage condition. Therefore, sure timing design can be achieved merely by checking the maximum delay time of the flip-flop 412.

In the first embodiment, by using the multi-phase timing signal J2 (clock signals P0 to P9), the operating frequencies of the respective constituent elements of the parallel-serial converter 320 (the respective units of the data holder 410, the switch unit 420, and the decode unit 430) can be set equal to or lower than half the operating frequency of the whole of the parallel-serial converter 320 (toggle frequency, the frequency of serial data in this example). The respective constituent elements of the parallel-serial converter 320 (flip-flop 412, switch element 422) can operate at an operating frequency equal to or lower than half (one-tenth, in this example) the operating frequency of serial data outputting by the parallel-serial converter 320. Thus, the maximum operating frequency as the parallel-serial conversion circuit can be enhanced. In other words, the toggle frequency can be set equal to or lower than half and thus operation with low power consumption is permitted.

In the first embodiment, the oscillator 210 of the reference timing generator 110D and the local timing reproducer 120D are configured by a current control oscillator. In the local timing reproducer 120D, the oscillation control current J0_1 corresponding to the loop filter output current Ilp is used in order to reproduce the frequency as timing information. Furthermore, the comparatively-low-speed PLL output clock CK_PLL output from the oscillator 210 in the reference timing generator 110D is used in order to reproduce the phase. The loop filter output current Ilp to control the unit delay element 212 of the oscillator 210 is substantially the same as the oscillation control current J0_1. The reference timing generator 110D supplies the oscillation control signal to control the respective unit delay elements 212 of its own oscillator 210 as the oscillation control current J0_1 for controlling the amount of delay of each of the unit delay elements 272 of the local timing reproducer 120D.

Although not shown in FIG. 2, it is also possible to employ a voltage control oscillator for the oscillator 210 of the reference timing generator 110D and the local timing reproducer 120D. In this case, in the local timing reproducer 120D, an oscillation control voltage is used instead of the oscillation control current J0_1 in order to reproduce the frequency as timing information, and the comparatively-low-speed PLL output clock CK_PLL output from the oscillator 210 in the reference timing generator 110D is used in order to reproduce the phase.

In either case, by using the oscillation control current J0_1 or the oscillation control voltage in order to reproduce the frequency of the multi-phase timing signal J2, a slight frequency deviation between the oscillator circuit in the local timing reproducer 120D and the oscillator 210 in the reference timing generator 110D can be corrected. Furthermore, by using the comparatively-low-speed PLL output clock CK_PLL generated by the oscillator 210 in the reference timing generator 110D in order to reproduce the phase of the multi-phase timing signal J2, accumulation of noise such as phase noise in the oscillator circuit loop in the local timing reproducer 120D can be reduced.

In addition, in the first embodiment, the same element as the constituent element (unit delay element 272) of the oscillator circuit as the constituent element of the local timing reproducer 120D is used as the constituent element (unit delay element 212) of the oscillator 210 of the reference timing generator 110D. Therefore, although the oscillation control current J0_1 corresponding to (substantially the same as) the loop filter output current Ilp is used, the multi-phase timing signal J2 in which the phase relationship among the respective clock signals P0 to P9 is proper can be reproduced and power consumption reduction and maximum operating frequency enhancement for the reference timing generator 110D can be achieved compared with the case in which different circuit constituent elements are used as the unit delay element 272 and the unit delay element 212.

Second Embodiment

[Entire Configuration]

Figure 5:
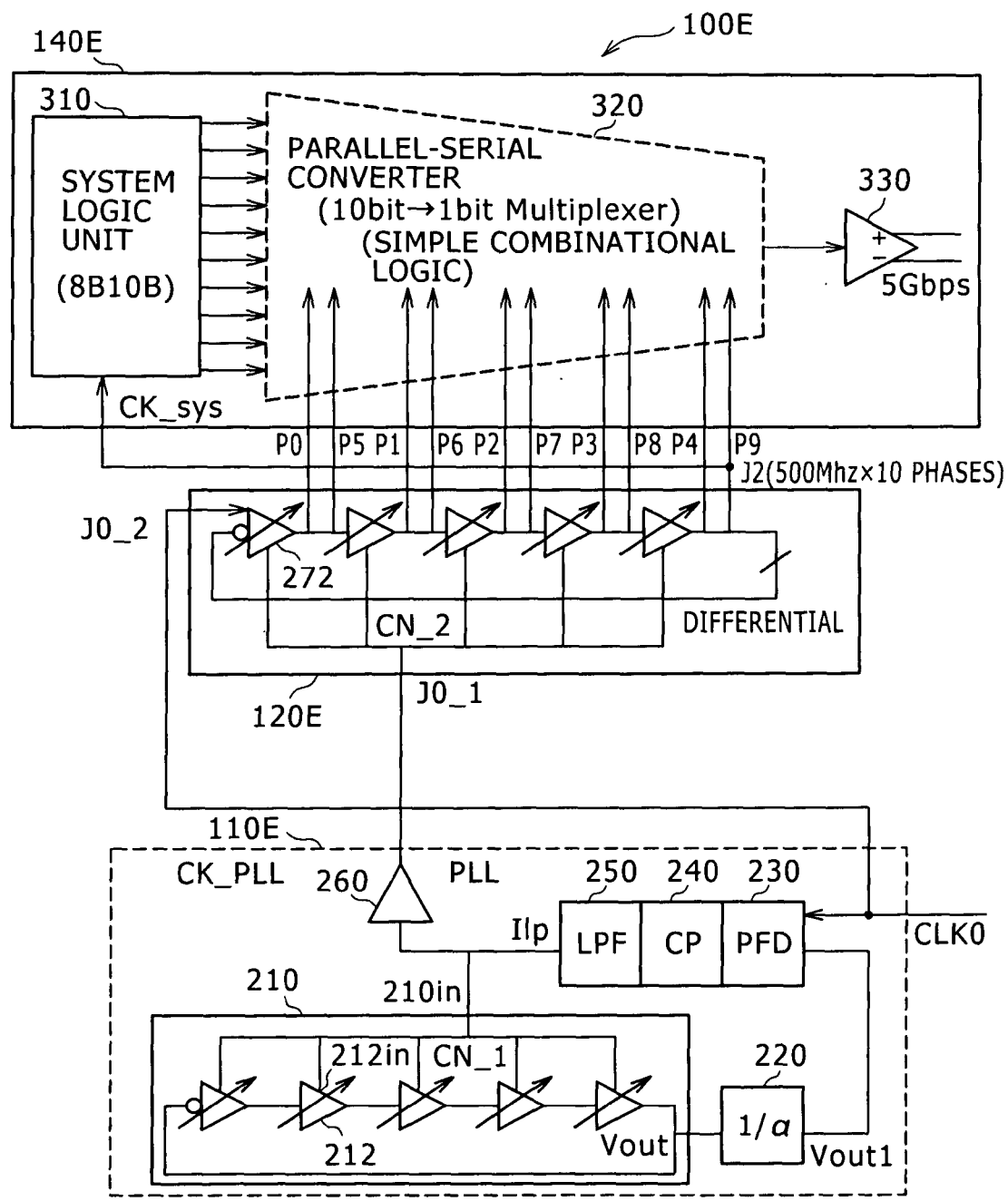
FIG. 5 is a diagram for explaining a timing generating circuit according to a second embodiment of the present invention.

FIG. 5 is a diagram for explaining the timing generating circuit 100 according to the second embodiment. FIG. 5 illustrates an example wherein the phase locking pulse signal is a reference clock signal, the local timing circuit comprises a ring buffer that includes the plurality of delay elements, and the control signal is a voltage or current control signal that is based upon a voltage or current control signal of the phase locked loop circuit.

A timing generating circuit 100E of the second embodiment utilizes a unit having a configuration based on a PLL as a reference timing generator 110E similarly to the first embodiment. Based on the configuration of the first embodiment, as a first modification, the external reference clock CLK0 supplied to the reference timing generator 110E (phase frequency detector 230 therein) is used instead of the PLL output clock CK_PLL as the phase locking pulse J0_2 supplied from the reference timing generator 110E having the PLL configuration to a local timing reproducer 120E.

As a second modification for the timing generating circuit 100E, one of the multi-phase timing signals J2 (in this configuration, the clock signal P9) output from the local timing reproducer 120E is used instead of the PLL output clock CK_PLL as the system clock CK_sys supplied to the system logic unit 310.

[Operation]

As long as the phase locking pulse J0_2 is periodically supplied to the local timing reproducer 120E, the frequency of the external reference clock CLK0 used as the phase locking pulse J0_2 does not necessarily need to be equalized to the frequency of the multi-phase timing signal J2 (500 Mhz, in this configuration).

Also in the second embodiment, the frequency of the phase locking pulse J0_2 is 1/α of the frequency of the PLL output clock CK_PLL output from the oscillator 210 of the reference timing generator 110E. In the case of equalizing the frequency of the PLL output clock CK_PLL to the frequency of the multi-phase timing signal J2 (500 Mhz, in this configuration), the cycle of locking to the local timing reproducer 120E is lower than that in the first embodiment unless the PLL frequency multiplication factor α is one. That is, the locking cycle is lower than the frequency of the multi-phase timing signal J2 (500 Mhz, in this configuration).

However, also in this case, the edge of the phase locking pulse J0_2 is periodically input to the local timing reproducer 120E (unit delay element 272 of the first stage therein). Thus, the phases among the respective clock signals P0 to P9 are controlled at equal intervals by the oscillation control current J0_1 and the phase locking pulse J0_2, and phase noise accumulated in the loop of the local timing reproducer 120E can be reduced.

However, because the locking cycle is lower than that in the first embodiment, possibly the effect to reduce phase noise is lower than that in the first embodiment. In view of this point, it is preferable, but not necessary, to equalize also the frequency of the external reference clock CLK0 to the frequency of the multi-phase timing signal J2 (500 Mhz, in this configuration) in order to equalize the frequency of the phase locking pulse J0_2 to the frequency of the multi-phase timing signal J2 (500 Mhz, in this configuration).

In the second embodiment, phase jitter due to the loop as the whole of the PLL does not have an influence on the phase locking pulse J0_2, but the influence of phase noise of the external reference clock CLK0 is directly reflected as phase noise of the phase locking pulse J0_2. Therefore, in the second embodiment, it is preferable to carry out phase alignment by using the external reference clock CLK0 including comparatively-less noise compared with the first embodiment. This allows even the second embodiment to have a configuration capable of reducing phase noise and so forth occurring in the loop of the local timing reproducer 120E.

That is, in the second embodiment, the phase reproduction in the local timing reproducer 120E is carried out by using, as the phase locking pulse J0_2, the external reference clock CLK0 input from the external to the reference timing generator 110E having a PLL configuration. This can reduce a random timing error such as phase noise occurring in the oscillator circuit in the local timing reproducer 120E.

In terms of comparison with a third embodiment of the present invention to be described later, an oscillator circuit based on a ring buffer including a circuit to which the reference phase edge can be input is used as the local timing reproducer 120E, and thus the frequency of the phase locking pulse J0_2 can be lowered.

Third Embodiment

[Entire Configuration]

Figure 6:
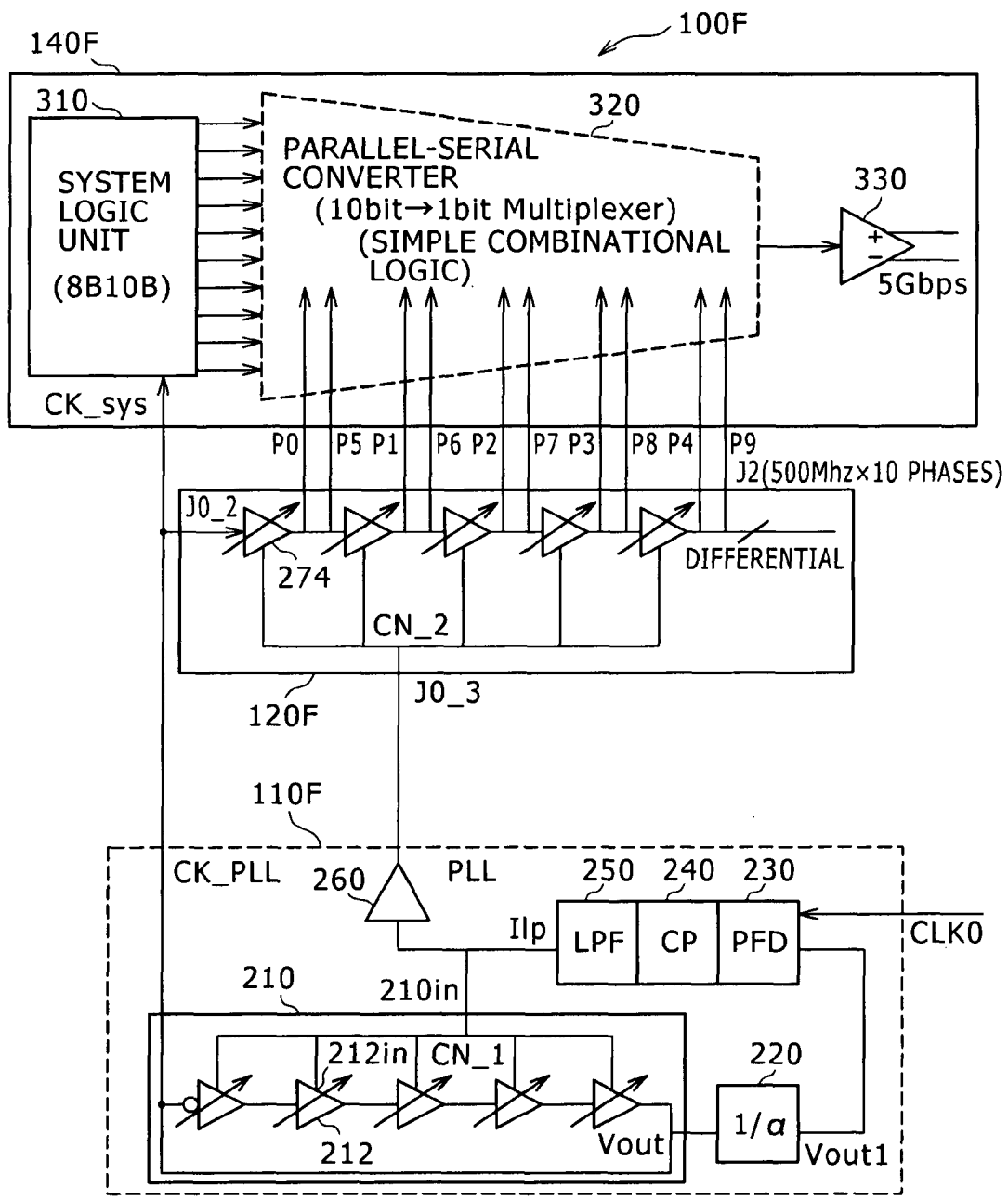
FIG. 6 is a diagram for explaining a timing generating circuit according to a third embodiment of the present invention.

FIG. 6 is a diagram for explaining the timing generating circuit 100 according to the third embodiment. FIG. 6 illustrates an example wherein the phase locking pulse signal is a clock output of the phase locked loop circuit, the local timing circuit comprises a delay line that includes the plurality of unit delay elements, and the control signal is a voltage or current control signal that is based upon a voltage or current control signal of the phase locked loop circuit.

A timing generating circuit 100F of the third embodiment utilizes a unit having a configuration based on a PLL as a reference timing generator 110F similarly to the first embodiment. Based on the configuration of the first embodiment, as a first modification, a circuit employing a delay line whose delay is controlled is used as a local timing reproducer 120F instead of the oscillator circuit based on a ring buffer including a circuit to which the reference phase edge can be input.

The local timing reproducer 120F of the third embodiment is configured by a delay circuit made by cascading plural unit delay elements 274 (referred to also as delay cell and delay stage), for example. In this configuration, as one example, five unit delay elements 274 are used, and a buffer circuit similar to that of the unit delay element 272 is used as the unit delay element 274.

In the local timing reproducer 120F, differential clock signals (500 Mhz) are output from the respective unit delay elements 274 and these signals are supplied to the unit delay elements 272 of the subsequent stages: In terms of the configuration, the local timing reproducer 120F is similar to the oscillator 210 and the local timing reproducer 120D in the first embodiment. However, the local timing reproducer 120F is different in that the output signal of the unit delay element 274_5 of the final stage is not returned to the input of the unit delay element 274_1 of the first stage.

As a signal to control the amount of delay of the delay line of the local timing reproducer 120F (clock signals P0 to P9 of 500 Mhz output from the respective unit delay elements 274), a delay amount control current or a delay amount control voltage (represented collectively as the delay amount control current/voltage J0_3) output from the reference timing generator 110F having a PLL configuration is used. In the case of using the delay amount control current as the delay amount control current/voltage J0_3, the configuration may be similar to that of the first embodiment. However, in the case of using the delay amount control voltage, a current-voltage conversion circuit functioning as a voltage buffer is used as the buffer unit 260 instead of a current-current conversion circuit functioning as a current buffer. Alternatively, a configuration including a current-voltage conversion circuit at the subsequent stage of the current-current conversion circuit is employed.

Furthermore, as a signal to control the phase of the delay line of the local timing reproducer 120F (clock signals P0 to P9 of 500 Mhz output from the respective unit delay elements 274), the PLL output clock CK_PLL is used as the phase locking pulse J0_2 supplied from the reference timing generator 110F having a PLL configuration to the local timing reproducer 120F, similarly to the first embodiment. In this case, the influence of phase noise of the external reference clock CLK0 is not directly reflected as phase noise of the phase locking pulse J0_2.

Although not shown in the diagram, the external reference clock CLK0 may be used as the phase locking pulse J0_2 similarly to the second embodiment. However, because the influence of phase noise of the external reference clock CLK0 is directly reflected as phase noise of the phase locking pulse J0_2 similarly to the second embodiment, it is preferable to carry out phase alignment by using the external reference clock CLK0 involving comparatively-less noise.

Each unit delay element 274 (buffer circuit) may have e.g. a configuration including a differential circuit made by using two transistors (e.g. field effect transistors) and a current source of a current value variable type, similarly to the unit delay element 212 of the first embodiment.

In the case of carrying out control for the current source of the current value variable type in the current mode, the delay amount control current is used as the delay amount control current/voltage J0_3. In the case of carrying out control for the current source of the current value variable type in the voltage mode, the delay amount control voltage is used as the delay amount control current/voltage J0_3. In either case, the bias current of the differential circuit is controlled by the current source of the current value variable type, and thereby the amount of delay due to the respective unit delay elements 274 is controlled.

[Operation]

In the third embodiment, merely the phase locking pulse J0_2 supplied to the unit delay element 274 of the first stage in the local timing reproducer 120F is sequentially delayed by the respective unit delay elements 274 to be output as the multi-phase timing signal J2 (clock signals P0 to P9). Therefore, the frequency of the phase locking pulse J0_2 needs to be accurately equalized to the frequency of the multi-phase timing signal J2 (500 Mhz, in this configuration).

Therefore, in principle, it will also be possible to use the external reference clock CLK0 as the phase locking pulse J0_2 and equalize the frequency of the external reference clock CLK0 to the frequency of the multi-phase timing signal J2 (500 Mhz, in this configuration) similarly to the second embodiment. However, in this case, the influence of phase noise of the external reference clock CLK0 is directly reflected as phase noise of the phase locking pulse J0_2 (similarly to the second embodiment), and it is further reflected as phase noise of the multi-phase timing signal J2 (clock signals P0 to P9).

In the third embodiment, because the local timing reproducer 120F has a delay line configuration made by cascading the unit delay elements 274, it can be said that phase noise occurring therein is at an ignorable level originally. The amount of conversion to phase noise from random noise generated by the unit delay element 274 itself is very small, and thus the phase noise is ignorable in the configuration made by merely connecting the unit delay elements 274 like the configuration in the third embodiment. In contrast, in a loop configuration (ring configuration) like those in the other embodiments, this small phase noise goes around and around and becomes large noise to appear as large phase shift (noise) in a comparatively-long cycle.

Furthermore, in the third embodiment, the same element as the constituent element (unit delay element 274) of the delay circuit as the constituent element of the local timing reproducer 120F is used as the constituent element (unit delay element 212) of the oscillator 210 of the reference timing generator 110F. The loop filter output current Ilp to control the unit delay element 212 of the oscillator 210 is substantially the same as the delay amount control current/voltage J0_3.

The reference timing generator 110F supplies the oscillation control signal to control the respective unit delay elements 212 of its own oscillator 210 as the delay amount control current/voltage J0_3 for controlling the amount of delay of each of the unit delay elements 274 of the local timing reproducer 120F. Therefore, although the delay amount control current/voltage J0_3 corresponding to (substantially the same as) the loop filter output current Ilp is used, the multi-phase timing signal J2 in which the phase relationship among the respective clock signals P0 to P9 is proper can be reproduced compared with the case in which different circuit constituent elements are used as the unit delay element 274 and the unit delay element 212.

Fourth Embodiment

[Entire Configuration]

FIGS. 7 to 10 are diagrams for explaining the timing generating circuits 100 according to the fourth embodiment. A timing generating circuit 100G (100Ga, 100Gb, 100Gc, 100Gd) of the fourth embodiment is so modified as to include a delay unit 280 and utilize a DLL as a reference timing generator 110G differently from the first embodiment, which includes the oscillator 210 and utilizes a PLL.

Figure 7:
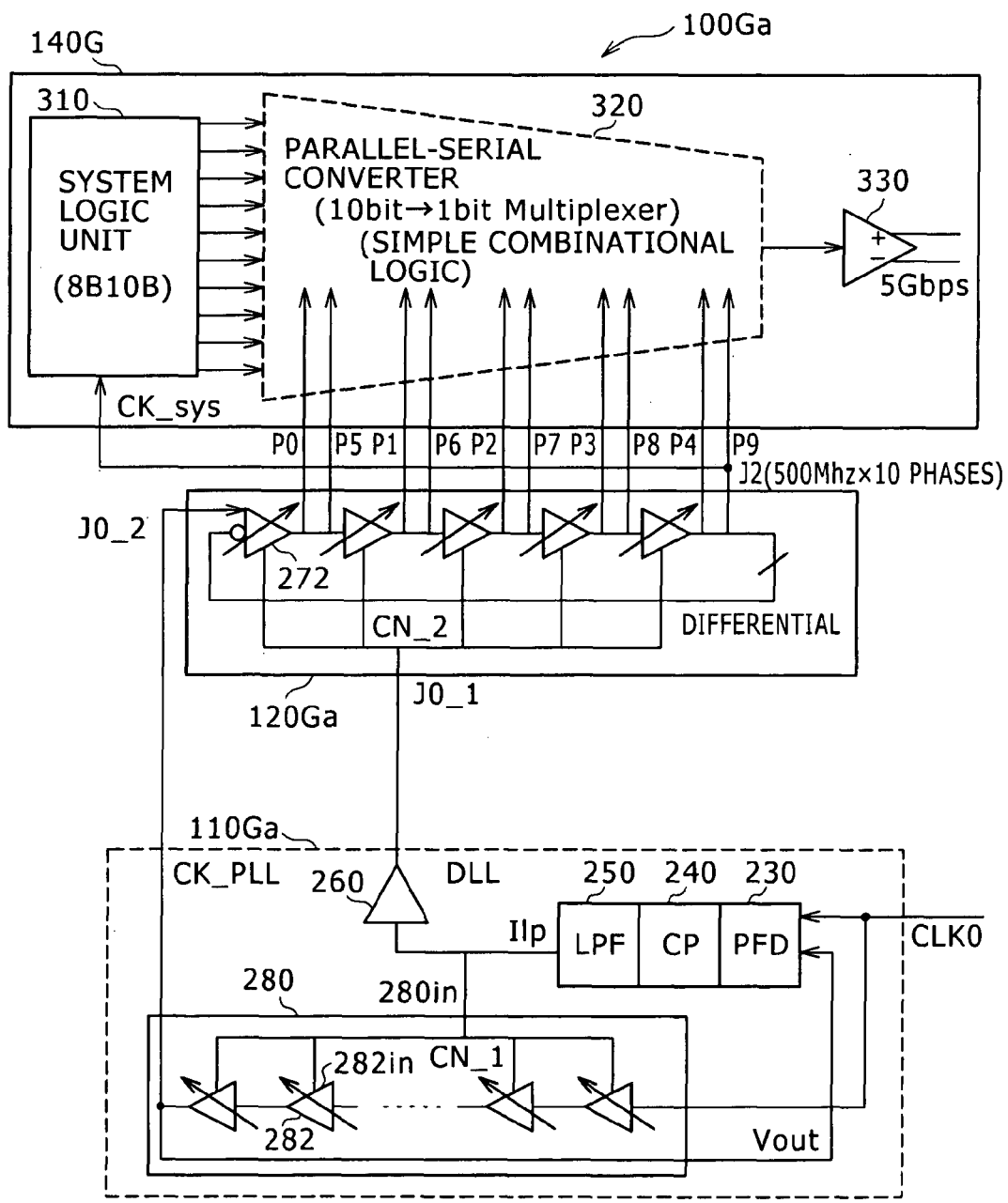
FIG. 7 is a diagram for explaining a timing generating circuit according to a fourth embodiment (first example) of the present invention.
Figure 8:
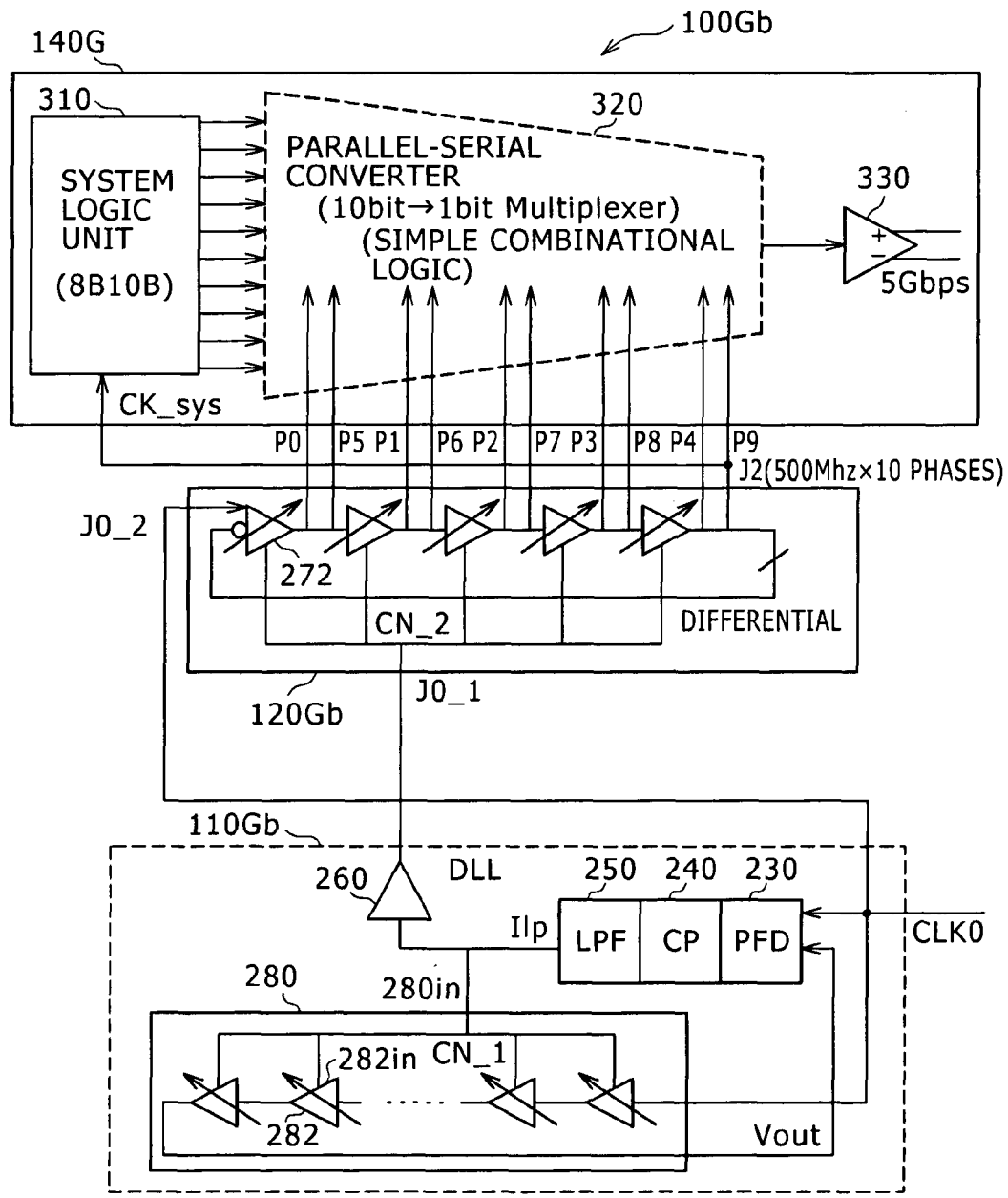
FIG. 8 is a diagram for explaining a timing generating circuit according to the fourth embodiment (second example)
Figure 9:
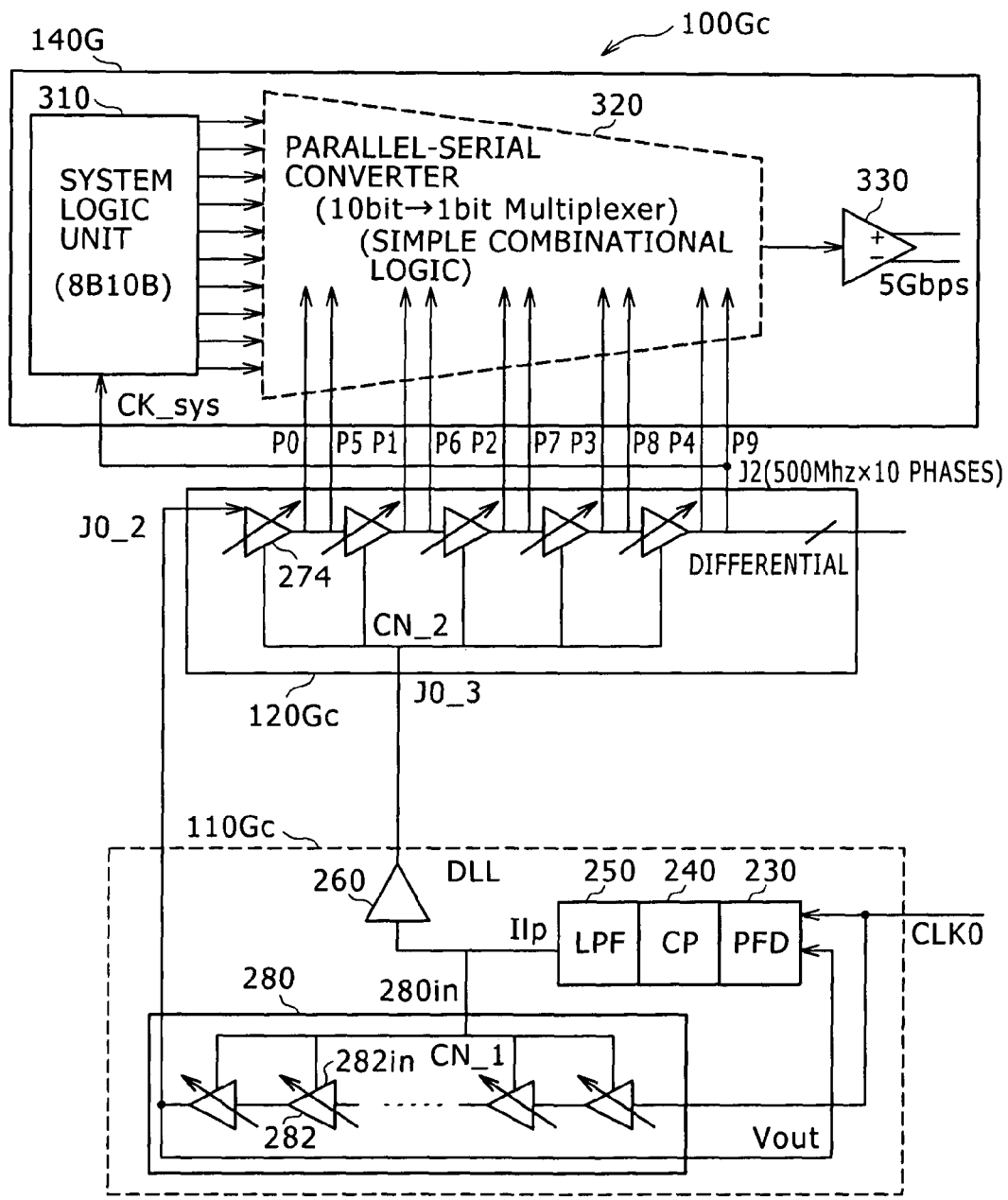
FIG. 9 is a diagram for explaining a timing generating circuit according to the fourth embodiment (third example)
Figure 10:
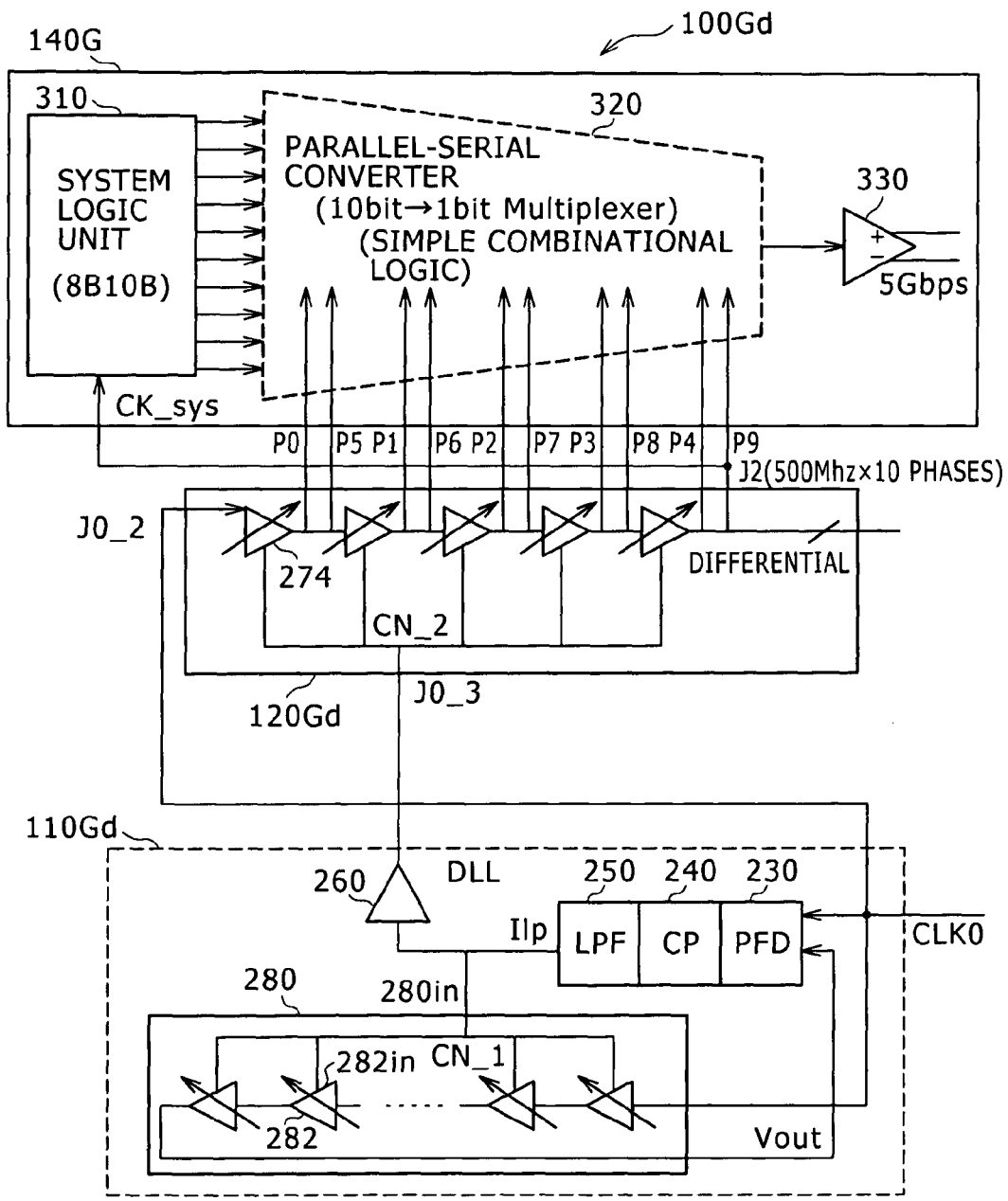
FIG. 10 is a diagram for explaining a timing generating circuit according to the fourth embodiment (fourth example)

FIG. 7 discloses an example embodiment wherein the phase locking pulse signal is a clock output of the delay locked loop circuit, the local timing circuit comprises a ring buffer that includes the plurality of delay elements, and the control signal is a voltage or current control signal that is based upon a voltage or current control signal of the delay locked loop circuit. FIG. 8 discloses an example wherein the phase locking pulse signal is a reference clock signal, the local timing circuit comprises a ring buffer that includes the plurality of delay elements, and the control signal is a voltage or current control signal that is based upon a voltage or current control signal of the delay locked loop circuit. FIG. 9 discloses an example wherein the phase locking pulse signal is a clock output of the delay locked loop circuit, the local timing circuit comprises a delay line that includes the plurality of delay elements, and the control signal is a voltage or current control signal that is based upon a voltage or current control signal of the delay locked loop circuit. FIG. 10 discloses an example wherein the phase locking pulse signal is a reference clock signal, the local timing circuit comprises a delay line that includes the plurality of delay elements, and the control signal is a voltage or current control signal that is based upon a voltage or current control signal of the delay locked loop circuit.

More specifically, the timing generating circuit 100Ga of the fourth embodiment (first example) shown in FIG. 7 and the timing generating circuit 100Gb of the fourth embodiment (second example) shown in FIG. 8 use, as local timing reproducers 120Ga and 120Gb, an oscillator circuit (local oscillator) based on a ring buffer including a circuit to which the reference phase edge can be input similarly to the first embodiment. The timing generating circuit 100Gc of the fourth embodiment (third example) shown in FIG. 9 and the timing generating circuit 100Gd of the fourth embodiment (fourth example) shown in FIG. 10 use, as local timing reproducers 120Gc and 120Gd, a circuit based on a delay line whose delay is controlled similarly to the third embodiment.

For example, the delay unit 280 of the fourth embodiment is made by cascading plural unit delay elements 282 (referred to also as delay cell and delay stage) similarly to the local timing reproducer 120F of the third embodiment. In this configuration, as one example, five unit delay elements 282 are used, and a buffer circuit is used as the unit delay element 282. The unit delay element 282 may be an element having the same configuration as that of the unit delay element 274 of the third embodiment.

To the unit delay element 282_1 of the first stage, the external reference clock CLK0 supplied from the external to one input terminal of the phase frequency detector 230 is supplied in common. The output signal of the unit delay element 282_end of the final stage serves as a pulse signal (DLL output clock CK_DLL) locked with the external reference clock CLK0. This pulse signal is supplied to the other input terminal of the phase frequency detector 230 and is used also as the phase locking pulse J0_2 to the local timing reproducer 120G.

In the timing generating circuit 100Ga of the fourth embodiment (first example) and the timing generating circuit 100Gc of the fourth embodiment (third example), the phase reproduction in the local timing reproducer 120G is carried out by using the DLL output clock CK_DLL as the phase locking pulse J0_2 similarly to the first embodiment. In this case, the influence of phase noise of the external reference clock CLK0 is not directly reflected as phase noise of the phase locking pulse J0_2.

In contrast, in the timing generating circuit 100Gb of the fourth embodiment (second example) and the timing generating circuit 100Gd of the fourth embodiment (fourth example), the phase reproduction in the local timing reproducer 120G is carried out by using the external reference clock CLK0 as the phase locking pulse J0_2 similarly to the second embodiment. However, in the second and fourth examples, because the influence of phase noise of the external reference clock CLK0 is directly reflected as phase noise of the phase locking pulse J0_2 similarly to the second embodiment, it is preferable to carry out phase alignment by using the external reference clock CLK0 involving comparatively-less noise compared with the first and third examples. This allows the local timing reproducers 120Gb and 120Gd in the second and fourth examples to ignore phase noise in the unit delay elements 282 because a loop by the unit delay elements 282 is absent.

Furthermore, the timing generating circuit 100G is so modified as to use one of the multi-phase timing signals J2 (clock signal P9, in this configuration) output from the local timing reproducer 120G as the system clock CK_sys supplied to the system logic unit 310 similarly to the second embodiment.

In the fourth embodiment, the number of stages (defined as β1) of the delay line (unit delay elements 282) in the delay unit 280 of the reference timing generator 110G having a DLL configuration is made different from the number of stages (defined as β2) of unit delay elements 272 (274) in the local timing reproducer 120G. This can realize a frequency multiplication function to set the frequency f_J2 of the multi-phase timing signal J2 (clock signals. P0 to P9) output from the local timing reproducer 120G by multiplying the frequency f_CLK0 of the external reference clock CLK0 input from the external by the desired frequency multiplication factor β.

The frequency multiplication factor β, the frequency f_CLK0 of the external reference clock CLK0, and the frequency f_J2 of the multi-phase timing signal J2 (clock signals P0 to P9) output from the local timing reproducer 120G are in a relationship of β=β1/β2 f_J2/f_CLK0. For example, if the frequency f_CLK0 of the external reference clock CLK0 is 100 Mhz and the number of stages of the unit delay elements 272 (274) of the local timing reproducer 120G is five and oscillation at the frequency f_J2 of 500 Mhz is necessary, the delay line (unit delay elements 282) of the delay unit 280 is configured with 25 stages.

[Operation]

In the fourth embodiment, the DLL output clock CK_DLL output from the reference timing generator 110G, obtained by delaying (locking) the external reference clock CLK0 by the unit delay elements 282, is used as the phase locking pulse J0_2. Therefore, phase jitter due to the loop as the whole of a PLL does not have an influence on the phase locking pulse J0_2 differently from the first embodiment.

However, in the reference timing generator 110G of the fourth embodiment, the number β1 of stages of the unit delay elements 282 of the delay unit 280 is set to "frequency multiplication factor β×the number β2 of stages of the unit delay elements 272 (274)" to realize the frequency multiplication function with the local timing reproducer 120G. Thus, the circuit scale is larger than that in the case of realizing the frequency multiplication function by the frequency divider 220 with a PLL configuration.

Fifth Embodiment

[Entire Configuration]

Figure 11:
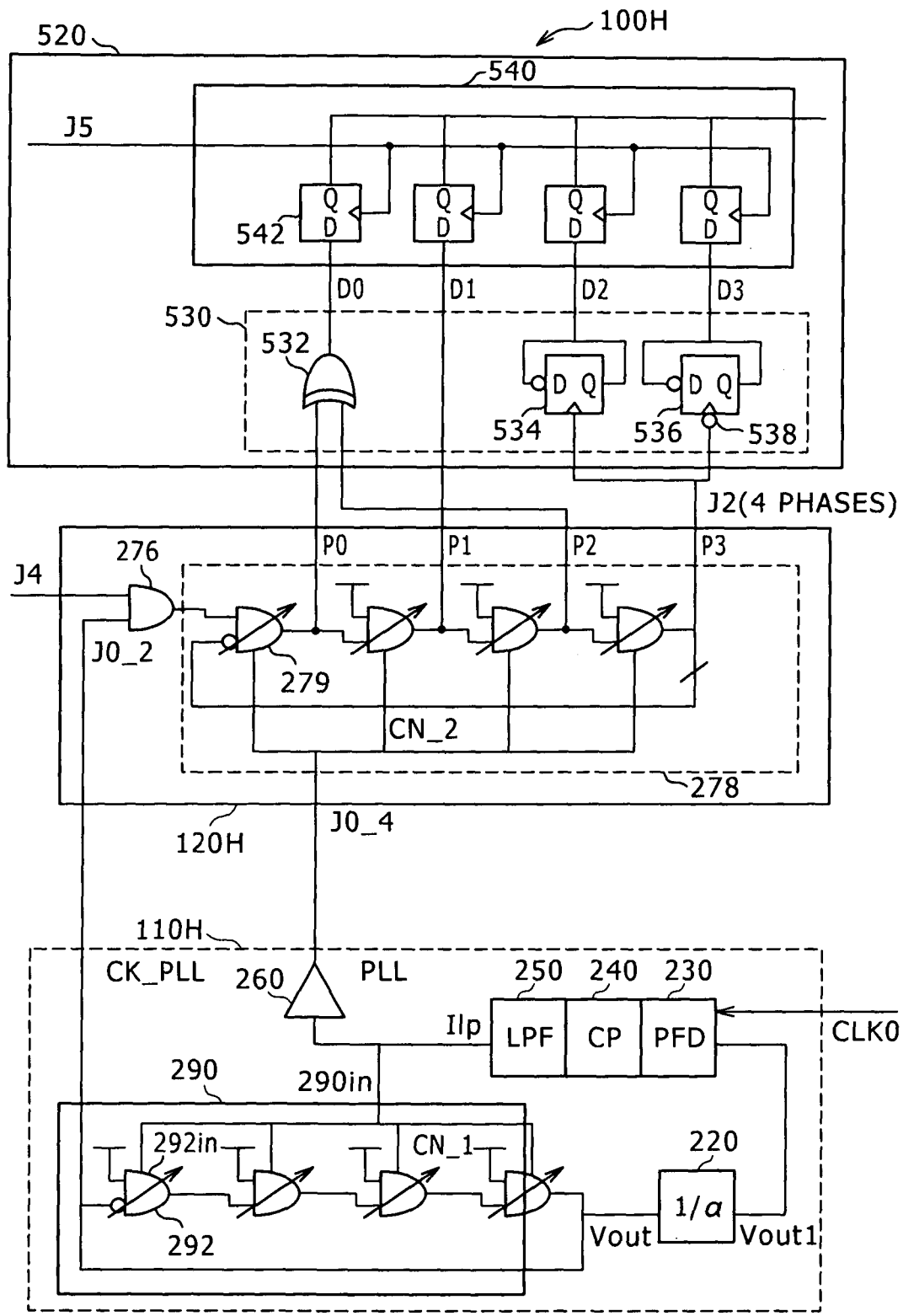
FIG. 11 is a diagram for explaining a timing generating circuit according to a fifth embodiment of the present invention.

FIG. 11 is a diagram for explaining the timing generating circuit 100 according to a fifth embodiment of the present invention. FIG. 11 is an example wherein the phase locking pulse signal is a clock output of the phase locked loop circuit, the local timing circuit comprises a ring buffer that includes the plurality of delay elements, the control signal is a voltage or current control signal that is based upon a voltage or current control signal of the phase locked loop circuit, and the digital signal processing circuit comprises a counter that receives the multi-phase timing signal.

In a timing generating circuit 100H of the fifth embodiment, a circuit (counter circuit) to which counter processing for which high-speed, low-power-consumption operation is required is applied is employed as a high-speed signal processor 140H that is disposed near a local timing reproducer 120H and required to execute high-speed processing.

The following description will deal with an example employing the timing generating circuit 100D of the first embodiment as the basis of the entire configuration. Although not shown in the diagram, the high-speed signal processor 140H can be similarly applied also to the second to fourth embodiments.

The basic concept of a reference timing generator 110H and the local timing reproducer 120H conforms to the first embodiment. Specifically, a PLL configuration is utilized as the reference timing generator 110H and an oscillator circuit (local oscillator) based on a ring buffer including a circuit to which the reference phase edge can be input is used as the local timing reproducer 120H. However, changes are added to the detailed configurations of them in matching with the high-speed signal processor 140H.

For example, the reference timing generator 110H of the fifth embodiment includes an oscillator 290 instead of the oscillator 210. The oscillator 290 is the same as the first embodiment in that an oscillator circuit based on a ring buffer is used. However, in this example, a gate circuit (AND gate, in this configuration) is used instead of a buffer circuit as plural unit delay elements 292 used in the oscillator 290.

The oscillator 290 serves as a negative feedback part as the connection and, in operation, serves as a positive feedback part due to phase shift attributed to the internal RC component (resistive component and capacitive component) so that a differential ring oscillator may be configured as a whole. For example, the respective unit delay elements 292 (AND gate) are cascaded and one input terminal of the AND gate is pulled up. Furthermore, the output signal of the unit delay element 292 of the final stage is returned to the input of the unit delay element 292 of the first stage. Single end clock signals (500 Mhz) are output from the respective unit delay elements 292 of the oscillator 290 of the reference timing generator 110H, and these signals are supplied to the unit delay elements 292 of the subsequent stages. To clarify that "the oscillator 290 serves as a negative feedback part as the connection," a symbol of "inverting input" is given to the input of the unit delay element 292 of the first stage as one example.

The frequency divider 220, the phase frequency detector 230, the charge pump unit 240, and the loop filter unit 250 are the same as those in the first embodiment.

As a signal to control the oscillation frequency of the local timing reproducer 120H, an oscillation control current or an oscillation control voltage (represented collectively as the oscillation control current/voltage J0_4) output from the reference timing generator 110H having a PLL configuration is used. In the case of using the oscillation control current as the oscillation control current/voltage J0_4, the configuration may be similar to that of the first embodiment. However, in the case of using the oscillation control voltage, a current-voltage conversion circuit functioning as a voltage buffer is used as the buffer unit 260 instead of a current-current conversion circuit functioning as a current buffer. Alternatively, a configuration including a current-voltage conversion circuit at the subsequent stage of the current-current conversion circuit is employed.

In the reference timing generator 110H having such a configuration, the output voltage Vcomp of the phase frequency detector 230, which is phase error information, is converted to the oscillation control current Icnt via the charge pump unit 240 and the loop filter unit 250 to be supplied to the oscillator 290. Furthermore, the oscillation frequency (=Oscillation frequency fcco) of the output oscillation signal Vout output from the oscillator 290 is controlled, and the phase thereof is locked with the digital data row of the PLL output clock CK_PLL as the output oscillation signal Vout. The PLL output clock CK_PLL is used as the phase locking pulse J0_2 to the local timing reproducer 120H.

The local timing reproducer 120H of the fifth embodiment includes a gate circuit 276 and a local oscillator 278.

The gate circuit 276 performs a logic operation of a count start signal J4 and the phase locking pulse J0_2 and supplies the logic output to the local oscillator 278. In this configuration, an AND gate is used as the gate circuit 276 as an example. In this case, the rising edge of the phase locking pulse J0_2 is supplied to the local oscillator 278 when the count start signal J4 is at the H-level.

As the local oscillator 278, an oscillator circuit based on a ring buffer is used similarly to the oscillator 290 included in the reference timing generator 110H. Furthermore, the local oscillator 278 is modified to a circuit to which the edge of the phase locking pulse J0_2 can be input via the gate circuit 276. That is, the local timing reproducer 120H uses the local oscillator 278 based on the ring buffer including the circuit to which the reference phase edge can be input.

As plural unit delay elements 279 used in the local oscillator 278, although detailed description of which is omitted, a gate circuit (AND gate, in this configuration) is used similarly to the oscillator 290, as one example. Single end multi-phase timing signals J2 (clock signals P0 to P3 of 500 Mhz) are output from the respective unit delay elements 279 of the local oscillator 278, and these signals are supplied to the unit delay elements 279 of the subsequent stages and supplied also to the high-speed signal processor 140H as described later.

As the reference timing signal J0 supplied from the reference timing generator 110H having a loop configuration to the local timing reproducer 120H, the oscillation control current/voltage J0_4 to decide the oscillation frequency of the local oscillator 278 and the PLL output clock CK_PLL of 500 Mhz to the gate circuit 276, having the roll of the phase locking pulse J0_2, are used.

As the circuit element to input the edge of the phase locking pulse J0_2 to the local timing reproducer 120H, in the fifth embodiment, the gate circuit 276 configured by an AND gate is used so that a logic operation with the count start signal J4 may also be performed.

From the local oscillator 278 (unit delay elements 279 therein) of the local timing reproducer 120H, four single end multi-phase clock signals (four-phase clock signals P0 to P3 of 500 Mhz) are supplied as the multi-phase timing signal J2 to the high-speed signal processor 140H, which is a counter circuit. For example, the P0-phase clock signal is output from the unit delay element 279_1 of the first stage. The P1-phase clock signal is output from the unit delay element 279_2 of the second stage. The P2-phase clock signal is output from the unit delay element 279_3 of the third stage. The P3-phase clock signal is output from the unit delay element 279_4 of the fourth stage.

[Detailed Configuration of High-Speed Signal Processor]

The high-speed signal processor 140H, which is disposed near the local timing reproducer 120H and required to execute high-speed processing, includes a Gray code counter 520 having a decode unit 530 and a data holder 540, and an output buffer (not shown).

The decode unit 530 is one example of the bit data generator to generate bit data of the count output based on the multi-phase timing signal J2 (clock signals P0 to P3) supplied from the local timing reproducer 120H. In this example, the respective bit data of a Gray code are generated by executing logic processing by using the multi-phase timing signal J2 (clock signals P0 to P3) output from the local timing reproducer 120H so that the high-speed signal processor 140H may function as the Gray code counter.

For example, the decode unit 530 has an EX-OR gate 532 (exclusive-OR gate), a D flip-flop 534, a D flip-flop 536, and an inverter 538. The inverter 538 is provided at the clock input terminal of the flip-flop 536. The inverter 538 for logic inversion of a signal to the clock input terminal of the flip-flop 536 is represented by giving a white-circle mark to the clock input terminal in the diagram.

The data holder 540 includes the same number of D flip-flops 542 as the number of bits (four, in this configuration) for holding Gray code data output from the decode unit 530. A count stop signal J5 is supplied in common to the clock input terminals of the respective flip-flops 542.

The decode unit 530 receives the multi-phase timing signal J2 (four-phase clock signals P0 to P3 of 500 Mhz) from the local timing reproducer 120H, and generates Gray code data by the respective logic elements (EX-OR gate 532, flip-flop 534, flip-flop 536, inverter 538) to supply the data to the corresponding flip-flop 542 in the data holder 540. As for the clock signal P1, the decode unit 530 makes it pass through the decode unit 530 as it is without executing particular logic processing to deliver it as count data D1 of the first bit to the flip-flop 542_1 for the first bit in the data holder 540.

Specifically, in the EX-OR gate 532, the clock signal P0 is supplied to one input terminal, and the clock signal P2 is supplied to the other input terminal. The EX-OR gate 532 sets its output to the H-level when the logical values of these signals are different from each other. The output of the EX-OR gate 532 is supplied as count data D0 of the zero-th bit to the flip-flop 542_0 for the zero-th bit.

Each of the flip-flop 534 and the flip-flop 536 is so connected that its own inverting output NQ is supplied to its own D input terminal, and is so configured as to carry out ½ frequency division operation (toggle operation). For this state, i.e. in order that the non-inverting output Q of the flip-flop 534 and the flip-flop 536 may be subjected to logic inversion by an inverter to be supplied to the D input terminal, the inverter is represented by giving a white-circle mark to the D input terminal in the diagram.

The clock signal P3 is supplied in common to the flip-flop 534 and the inverter 538. Therefore, the flip-flop 534 carries out ½ frequency division operation in synchronization with the rising edge of the clock signal P3, and its non-inverting output Q is supplied as count data D2 of the second bit to the flip-flop 542_2 for the second bit. The flip-flop 536 carries out ½ frequency division operation in synchronization with the falling edge of the clock signal P3, and its non-inverting output Q is supplied as count data D3 of the third bit to the flip-flop 542_3 for the third bit.

The respective flip-flops 542 hold the four-bit count outputs D0 to D3 from the decode unit 530 in synchronization with the rising edge of the count stop signal J5.

The Gray code counter 520 of the high-speed signal processor 140H having such a configuration receives the multi-phase timing information (four-phase clock signals P0 to P3 of 500 Mhz) from the local timing reproducer 120H, and generates the count data D0 to D3 by the decode unit 530. By using the multi-phase clock signal (clock signals P0 to P3) supplied from the local oscillator 278 of the local timing reproducer 120H, the Gray code counter 520 realizes high-speed, low-power-consumption count operation.

In the present configuration example, the clock signals P0 to P3 are input to the decode unit 530, and thereby the Gray code count result is directly generated as the four-bit output of the data D0 to D3. That is, a four-bit Gray code counter is realized by the decode unit 530, which generates the count output and has a simple configuration, and the flip-flops 542 to hold the count output. The count data D0 to D3 of the Gray code held by the data holder 540 are output via the output buffer (not shown).

[Operation]

Figure 12:
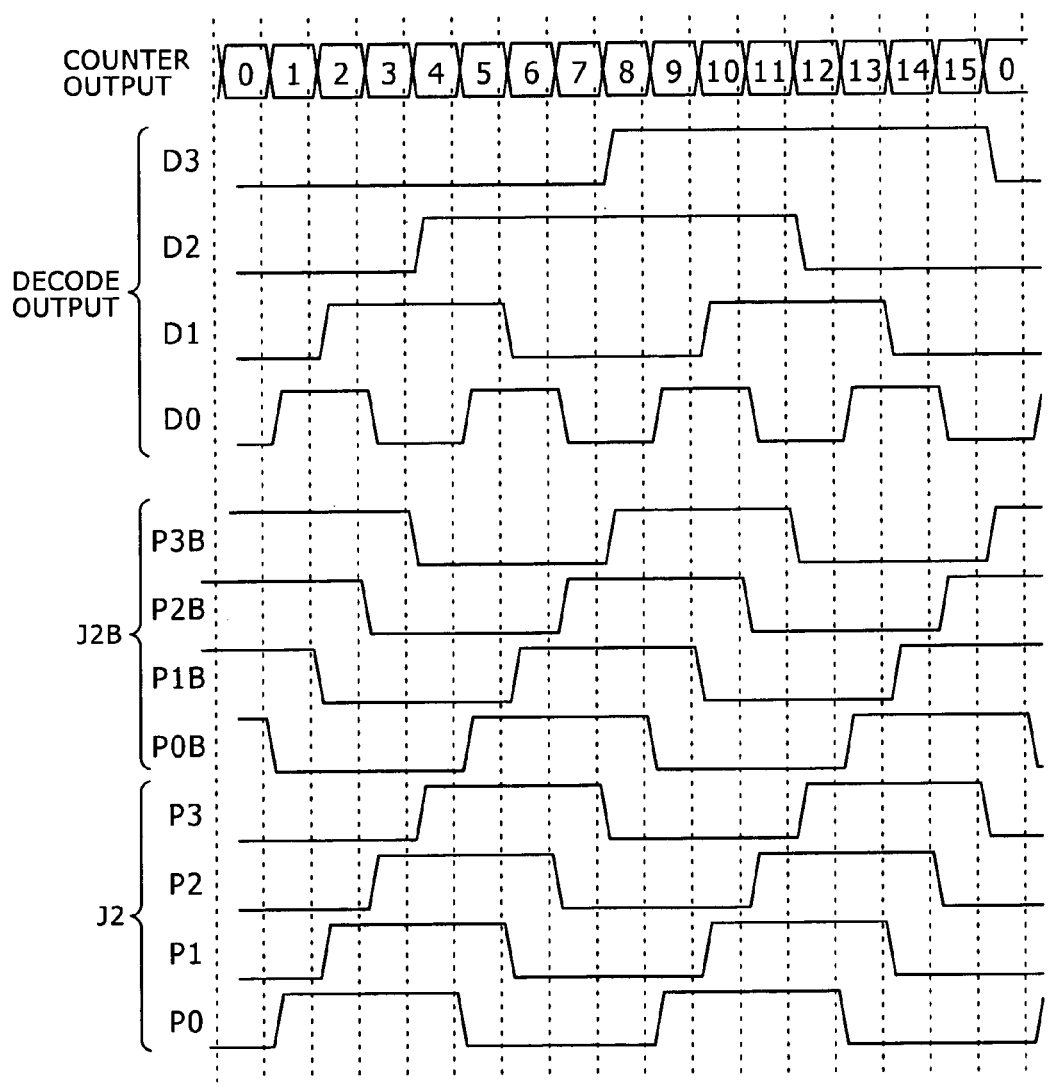
FIG. 12 is a timing chart for explaining the operation of the timing generating circuit of the fifth embodiment.

FIG. 12 is a timing chart for explaining the operation of the timing generating circuit 100H of the fifth embodiment.

On lower rows in FIG. 12, the states of the clock signals P0 to P3 as the multi-phase timing signal J2 output from the local timing reproducer 120H are shown. On the next upper rows, inverted multi-phase timing signals J2B (inverted clock signals P0B to P3B) resulting from logic inversion of the multi-phase timing signals J2 (clock signals P0 to P3) are shown.

By the periodic input of the edge of the phase locking pulse J0_2 to the local timing reproducer 120H (the unit delay element 279 of the first stage therein) via the gate circuit 276, the phases among the respective clock signals P0 to P3 and among the inverted clock signals P0B to P3B are precisely controlled at equal intervals by the oscillation control current/voltage J0_4 and the phase locking pulse J0_2, and phase noise accumulated in the loop of the local timing reproducer 120H can be reduced.

On rows above the inverted clock signals P0B to P3B, the states of the bit data D0 to D3 as the count data of the Gray code generated by the data holder 540 are shown. Similarly to the multi-phase timing signal J2 (clock signals P0 to P3, inverted clock signals P0B to P3B), phase noise can be reduced also for the phase among the bit data D0 to D3.

On the uppermost row in FIG. 12, the state of the counter output value (count data of the Gray code) output from the data holder 540 is shown.

In response to input of the count start signal J4 to the local oscillator 278 via the gate circuit 276 (AND gate), reproduction of the multi-phase timing signal J2 (clock signals P0 to P3) is started.

This is shown in the waveforms of the multi-phase timing signals J2 (clock signals P0 to P3) on lower rows in FIG. 12. By input of the clock signals P0 to P3 to the decode unit 530, the Gray code count result is directly generated as the four-bit outputs of the count data D0 to D3.

The four-bit count outputs D0 to D3 are input to the corresponding flip-flops 542 of the data holder 540 and held by the count stop signal J5. Thereby, the count outputs are held and output.

In the fifth embodiment, by using the multi-phase timing signal J2 (clock signals P0 to P3), the operating frequencies of the respective constituent elements of the Gray code counter 520 (the flip-flops 542 and the respective elements of the decode unit 530) can be set equal to or lower than half the operating frequency of the whole of the Gray code counter 520 (toggle frequency: count frequency in this example). Because the operating frequencies of all signals/circuits can be set equal to or lower than half the count frequency, the maximum operating frequency as the counter circuit can be enhanced. In other words, the toggle frequency can be set equal to or lower than half and thus operation with low power consumption is permitted.

In the above description, as the reference timing generator 110H and the local timing reproducer 120H, units having configurations different from those in the first to fourth embodiments are employed. However, it is also possible to utilize the units in the first to fourth embodiments and add a modification to these units. For example, it will be possible to add the gate circuit 276 of the fifth embodiment to the previous stage of the unit delay element 272 or the unit delay element 274. This can provide a configuration in which parallel count output data is converted to serial data and output to the subsequent-stage circuit when the high-speed signal processors 140D to 140G of the first to fourth embodiments are also applied to the high-speed signal processor 140H of the fifth embodiment (refer to a solid-state imaging device 1 to be described later).

Sixth Embodiment

[Detailed Configuration of High-Speed Signal Processor]

Figure 13:
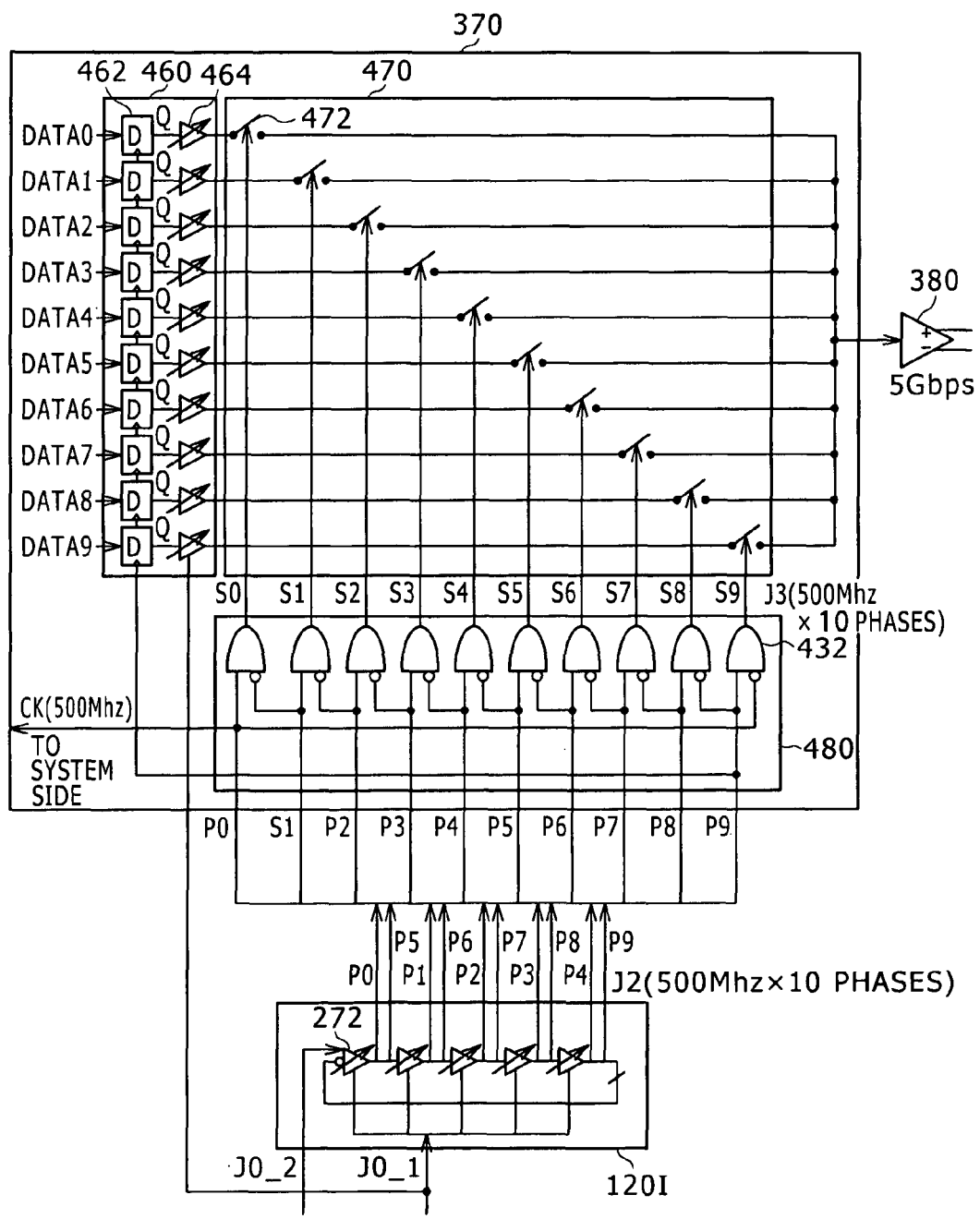
FIG. 13 is a diagram for explaining a configuration example of a high-speed signal processor according to a sixth embodiment of the present invention.

FIG. 13 is a diagram for explaining a configuration example of a high-speed signal processor 140I according to a sixth embodiment of the present invention. Although not shown in the diagram, the entire configuration of a timing generating circuit 100I of the sixth embodiment is the same as that of the first embodiment. However, the high-speed signal processor 140I includes a parallel-serial converter 370 instead of the parallel-serial converter 320. A system logic unit 360 (not shown) having the same configuration as that of the system logic unit 310 is provided at the previous stage of the parallel-serial converter 370, and an output buffer 380 having the same configuration as that of the output buffer 330 is provided at the subsequent stage of the parallel-serial converter 370.

The parallel-serial converter 370 of the high-speed signal processor 140I includes a data holder 460, a switch unit 470, and a decode unit 480. The data holder 460 includes plural D flip-flops 462 to hold data and plural unit delay elements 464. The switch unit 470 includes switch elements 472 that are each provided corresponding to a respective one of the flip-flops 462 and sequentially select the output of the flip-flop 462 exclusively. The decode unit 480 controls the on/off-operation of the respective switch elements 472. The flip-flop 462, the unit delay element 464, and the switch element 472 are provided for each of ten-bit parallel data.

In terms of comparison from the first embodiment, the data holder 460 corresponds to the data holder 410 but differs in that it includes the unit delay elements 464. The switch unit 470 has the same configuration as that of the switch unit 420, and the decode unit 480 has the same configuration as that of the decode unit 430.

The unit delay element 464 is provided in order to ensure a timing margin between the parallel circuit selection signal J3 (ten-phase selection signals S0 to S9) and parallel data. It is preferable to use, as the unit delay element 464, an element that has not only the function to merely delay data but also a function to carry out delay adjustment of parallel data. It is preferable to use the same circuit as the unit delay element 272, which is used in a local timing reproducer 120I and whose delay is controlled, as the unit delay element 464 having the function to carry out delay adjustment. In this case, each unit delay element is supplied with the oscillation control current J0_1 similarly to the unit delay element, 272, to thereby enable timing adjustment with the correctly-controlled amount of delay. The following description is based on the assumption that the unit delay element 464 is the same as the unit delay element 272 unless a particular note is made.

In linkage with the feature that the data holder 460 includes the unit delay elements 464 at the subsequent stages of the flip-flops 462, the lines of the timing signal to decide the data hold timing are made different from those in the first embodiment.

Specifically, to the flip-flops 462 for all bits, the clock signal that defines the selection signal to control the on-timing of the switch element 472 selected last is supplied in common as the pulse that defines the data hold timing. In the example of the diagram, out of ten bits, the zero-th bit is selected first and the ninth bit is selected last. Therefore, the P9-phase clock signal is supplied in common to the clock input terminals of all flip-flops 462_0 to 462_9 for ten-bit data.

The parallel-serial converter 370 of the high-speed signal processor 140I having such a configuration receives the multi-phase timing information (ten-phase clock signals of 500 Mhz) from the local timing reproducer 120I, and generates the parallel circuit selection signals S0 to S9 by the decode unit 480. Thereby, the parallel-serial converter 370 sequentially selects one-bit data from the flip-flops 462_0 to 462_9 holding ten-bit parallel data, to thereby realize a high-speed parallel-serial conversion function.

[Operation]

Figure 14:
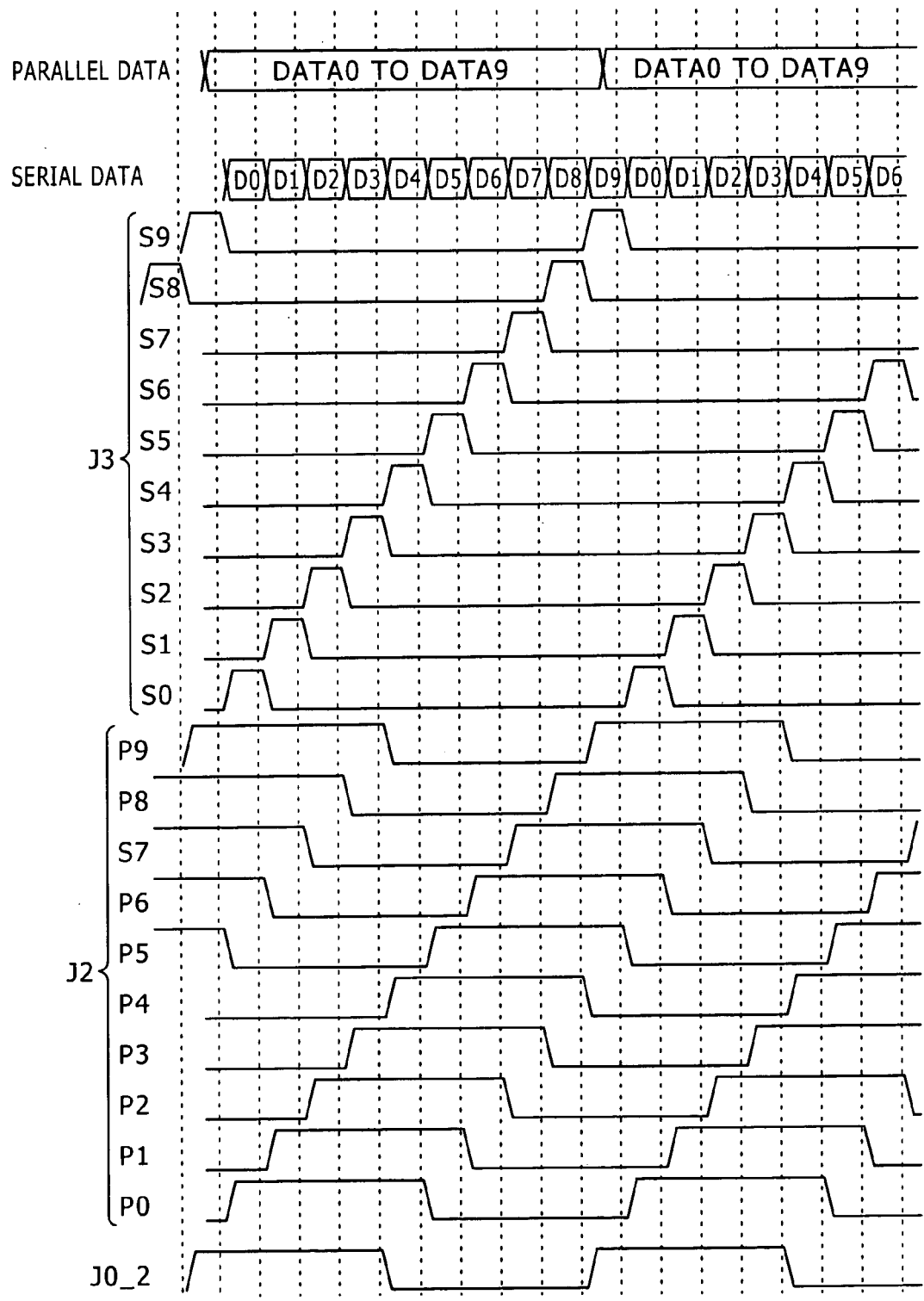
FIG. 14 is a timing chart for explaining the operation of a timing generating circuit of the sixth embodiment.

FIG. 14 is a timing chart for explaining the operation of the timing generating circuit 100I of the sixth embodiment.

On the lowermost row in FIG. 14, the state of the phase locking pulse J0_2 (=PLL output clock CK_PLL) of 500 Mhz supplied to the local timing reproducer 120I is shown. On the next upper rows, the states of the respective clock signals P0 to P9 as the multi-phase timing signal J2 output from the local timing reproducer 120I are shown. By the periodic input of the edge of the phase locking pulse J0_2 to the local timing reproducer 120I (the unit delay element 272 of the first stage therein), the phases among the respective clock signals P0 to P9 are precisely controlled at equal intervals by the oscillation control current J0_1 and the phase locking pulse J0_2, and phase noise accumulated in the loop of the local timing reproducer 120I can be reduced.

On middle rows in FIG. 14, the states of the respective selection signals S0 to S9 as the parallel circuit selection signal J3 generated by the decode unit 480 of the high-speed signal processor 140I by use of the multi-phase timing signal J2 (clock signals P0 to P9) are shown. Similarly to the multi-phase timing signal J2 (clock signals P0 to P9), phase noise can be reduced also for the phases among the respective selection signals S0 to S9.

On upper rows in FIG. 14, the states of the ten-bit parallel data DATA0 to DATA9 supplied from the system logic unit 360 to the parallel-serial converter 370 and the serial data output from the parallel-serial converter 370 via the output buffer 380 are shown.

As shown in FIG. 13, the ten-bit parallel data DATA0 to DATA9 are temporarily held by the flip-flops 462_0 to 462_9 of the corresponding bit.

It will be possible to hold bit data by all flip-flops 462_0 to 462_9 by using the rising edge of one of the clock signals P0 to P9 (clock signal P0). Basically, if the held ten-bit data are sequentially selected and output by the parallel circuit selection signal J3 (selection signals S0 to S9) generated by the decode unit 480, operation of parallel-serial conversion from ten bits to one bit can be realized.

However, in the case of using the clock signal P0 as the clock to hold the ten-bit data in common to all flip-flops 462, if the held data DATA0 is selected and output by the selection signal S0 made from the rising edge of the clock signal P0, there is a fear that a timing error in which the held data DATA0 is selected before being sufficiently determined occurs and the serial data cannot be accurately output.

As a countermeasure thereagainst, in the first embodiment, not the clock signal P0 but the clock signal P9 of the previous phase is used as the clock to hold the bit data DATA0 of the zero-th bit by the flip-flop 4120. In this case, two kinds of lines are necessary as the lines of the timing signal to decide the data hold timing, and thus possibly routing of the lines of the timing signal becomes a problem.

In contrast, in the sixth embodiment, in order that the number of kinds of the line of the timing signal to decide the data hold timing may be one, the unit delay element 464 that is the same as the unit delay element 272 is provided at the subsequent stage of the flip-flop 462 and the P9-phase timing signal is used as the timing signal to decide the data hold timing. Therefore, the transition timing of the parallel data input to the respective switch elements 472 is surely delayed from the rising edge of the timing signal P9 by the amount of delay due to the unit delay element 464. In addition, if the same element as the unit delay element 272 is used as the unit delay element 464 and the amount of delay of the unit delay element 464 is also controlled by the oscillation control current J0_1 similarly to the unit delay element 272, timing adjustment can be carried out by the correctly-controlled amount of delay.

Due to this feature, the held data DATA0 can be selected after being sufficiently determined and the serial data can be accurately output although the clock signal P9 is used as the clock to hold parallel data in common to all flip-flops 462 and the held data DATA0 is selected and output by the selection signal S0 made from the rising edge of the clock signal P9. The sixth embodiment also provides such timing design that the bit data DATA0 of the zero-th bit can be selected by the selection signal S0 surely.

<Summarization of Operation and Effects of Respective Embodiments>

The following conclusions are achieved from the descriptions of the first to sixth embodiments.

1) In the embodiments, the reference timing generator 110 may be disposed at a position remote from the respective high-speed signal processors 140. From the reference timing generator 110, the reference timing signal J0 is supplied to the local timing reproducer 120 disposed near each of the respective high-speed signal processors 140. Furthermore, the local timing reproducer 120 locally reproduces the multi-phase timing signal J2 and supplies it to the high-speed signal processor 140. This configuration can lower the toggle frequency of the clock signal and so forth in the high-speed signal processor 140 (e.g. parallel-serial conversion circuit, serial-parallel conversion circuit, counter circuit, calculating circuit used in a CPU or the like) required to execute high-speed processing, and can enhance the maximum operating speed of the respective circuits.

2) The toggle frequency of the external reference clock CLK0 to the reference timing generator 110, used as the phase locking pulse J0_2, and the multi-phase timing signal J2 is lowered. Thus, the activation ratio of the reference timing generator 110 and the local timing reproducer 120 is lowered, which enables circuit operation with low power consumption.

3) In general, for high-speed circuit blocks dotted inside a semiconductor integrated circuit such as a large scale integrated circuit (LSI), a high-speed clock signal is generated for the high-speed operation thereof. Therefore, the power consumed by a clock distributing circuit to distribute the high-speed clock signal to the respective circuits is high. In contrast, the mechanisms of the embodiments eliminate the need to distribute the high-speed clock signal, and thus can achieve power consumption reduction of the whole of the semiconductor integrated circuit.

4) It will also be possible to generate a multi-phase clock signal instead of the high-speed clock signal in the reference timing generator 110. However, also in the case of distributing the multi-phase clock signal from the reference timing generator 110, a lot of labor is needed for implementation in the circuit design and the layout and adjustment work in order to correctly keep the phases among the respective clock signals. As a result, possibly the circuit area becomes larger and the power consumption increases. In contrast, in the embodiments, the multi-phase timing signal J2 as the multi-phase clock signal does not need to be distributed from the reference timing generator 110 directly to the respective high-speed signal processors 140. Thus, power consumption reduction and area reduction can be realized without the above-described disadvantages.

5) In the relationship with 4), also in the reference timing generator 110 to generate the reference clock, a low-speed pulse signal may be generated instead of a high-speed clock required in the respective high-speed signal processors 140. Therefore, maximum operating frequency enhancement and power consumption reduction of the reference timing generator 110 (PLL, DLL, or the like) can also be achieved.

6) Due to e.g. variation in the device characteristics between the oscillator circuit used in a PLL, a DLL, or the like for the reference timing generation and the circuit of the local timing reproducer 120, possibly the frequencies of the pulse signals output from these two circuits cannot be equalized to each other even when the control voltage or the control current is shared. Consequently, a frequency correction circuit or the like is necessary in some cases.

In contrast, in the embodiments, phase alignment is carried out by supplying also the low-speed phase locking pulse J0_2 to the local timing reproducer 120 in addition to the control voltage or the control current. Thus, if the frequency of the multi-phase timing signal J2 output from the local timing reproducer 120 is the same as the frequency of the phase locking pulse J0_2, the frequencies of both can be made to correspond with each other without a correction circuit or the like.

If the frequency of the multi-phase timing signal J2 is 500 Mhz, it is also possible to use e.g. a frequency lower than 500 Mhz as the frequency of the phase locking pulse J0_2. However, in this case, operation failure will occur due to the deviation between the frequency of the oscillator circuit of the reference timing generator 110 and the frequency of the oscillator circuit of the local timing reproducer 120. For example according to a test production example and a report example of a general document, oscillation frequency deviation of about 2% will occur. That is, in the case of 500 Mhz (2 ns), the cycle is possibly 2.04 ns in the oscillator of the local timing reproducer 120, and 50 cycles yield the deviation equal to the original one cycle. Thus, it can be said that the frequencies involve deviation if the phase locking pulse J0_2 has a frequency equal to or lower than 1/50. For example, this phenomenon possibly occurs in the case in which the external reference clock of 5 Mhz is multiplied by 100 to make 500 Mhz and 5 Mhz is used as the phase locking pulse J0_2. Furthermore, if a low frequency is used as the phase locking pulse J0_2, even when this frequency is equal to or higher than 1/50, a large phase change (noise) occurs in phase alignment. Thus, a problem of a timing error in the high-speed signal processor and so forth will occur even if the frequencies can be made to correspond with each other.

7) Supplying the phase locking pulse J0_2 to the local timing reproducer 120 provides the following additional advantageous effect. Specifically, when the local timing reproducer 120 has a loop configuration, accumulation of phase noise due to the loop can be reduced, and the accurate multi-phase timing signal J2 can be reproduced.

8) In the embodiments, if the high-speed signal processor 140 is operated at high speed by the multi-phase timing signal J2 whose frequency is lower than the frequency of the output signal of the high-speed signal processor 140, the local timing reproducer 120 is disposed near the high-speed signal processor 140 in order to ensure a timing margin of the circuit operation. Furthermore, as a device of the local timing reproducer 120, the unit delay element 272 or the like whose delay is controlled by substantially the same signal as the signal to control the oscillator circuit (oscillator 210, 280, 290) of the reference timing generator 110 is used for carrying out timing adjustment. Therefore, timing design with suppression in a small timing margin in high-speed operation can be realized.

<Example of Application to Electronic Apparatus>

Figure 15:
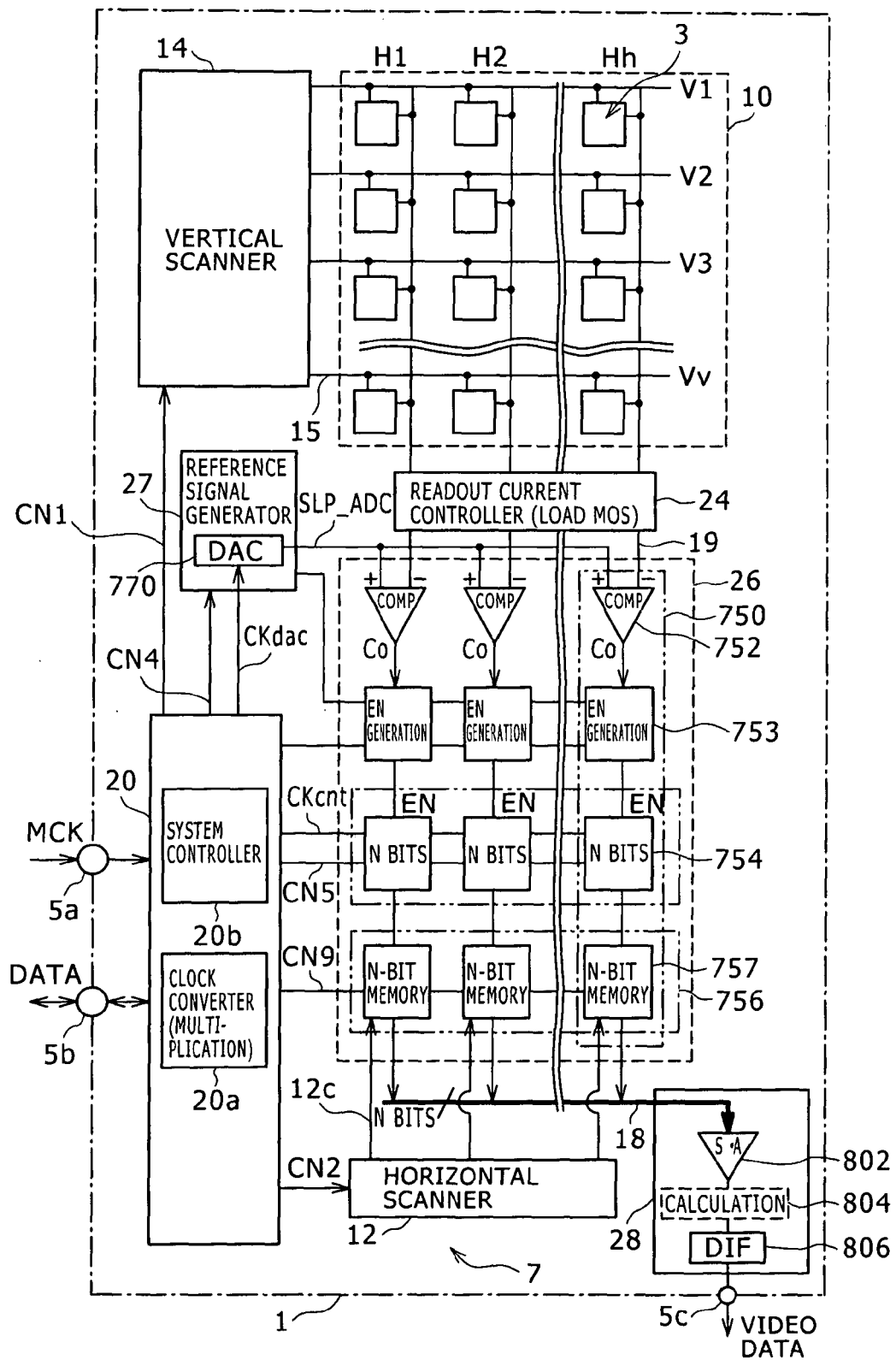
FIG. 15 is a diagram for explaining a solid-state imaging device as one example of electronic apparatus to which the timing generating circuit described for the first to sixth embodiments is applied.

FIG. 15 is a diagram for explaining a solid-state imaging device as one example of an electronic apparatus to which the timing generating circuit 100 described for the first to sixth embodiments is applied. FIG. 15 shows a basic configuration diagram of a CMOS solid-state imaging device (CMOS image sensor) as one form of the solid-state imaging device.

The timing generating circuit 100 can be applied also to an imaging device into which the solid-state imaging device is incorporated. In this case, as the imaging device, the same advantageous effects as those by the solid-state imaging device can be achieved. The term "imaging device" refers to e.g. a camera (or camera system) or an apparatus having the imaging function. Furthermore, the term "imaging" encompasses not only capturing of an image in normal camera photography but also fingerprint detection and so forth in the broad sense. The solid-state imaging device is one example of a semiconductor device, too. The solid-state imaging device is utilized as e.g. an imaging unit in a portable terminal such as a cellular phone and a portable notebook personal computer.

A solid-state imaging device 1 has a pixel array unit 10 in which plural unit pixels 3 are arranged in a two-dimensional matrix. In FIG. 15, the unit pixels 3 are shown with omission of part of the rows and columns thereof for easy representation. However, actually several tens to several thousands of the unit pixels 3 are disposed on each row and each column. From the unit pixels 3, a pixel signal voltage Vx is output via a vertical signal line 19 on a column-by-column basis.

In the pixel signal voltage Vx of the vertical signal line 19, as the time series, a signal level Ssig appears after a reset level Srst including noise of the pixel signal as the reference level. The signal level Ssig is equal to the level obtained by adding a signal component Vsig to the reset level Srst, and the signal component Vsig is obtained from Ssig (=Srst+Vsig)−Srst.

The solid-state imaging device 1 further has a column AD conversion unit 26 in which AD converters 750 for correlated double sampling (CDS) processing and digital conversion are provided in parallel to the columns.

The solid-state imaging device 1 further includes a drive controller 7, a readout current source unit 24 including a load MOS to supply an operating current for pixel signal readout to the unit pixel 3, a reference signal generator 27 that supplies a reference signal SLP_ADC for AD conversion to the column AD conversion unit 26, and an output unit 28.

The drive controller 7 includes a horizontal scanner 12 (column scan circuit), a vertical scanner 14 (row scan circuit), and a communication-and-timing controller 20 for realization of the control circuit function to sequentially read out the signals of the pixel array unit 10.

The horizontal scanner 12 has a horizontal address setting unit, a horizontal driver, and so forth to control the column address and column scanning, although not shown in the diagram, and specifies the column position of data that should be read out in data transfer operation. The vertical scanner 14 has a vertical address setting unit, a vertical driver, and so forth to control the row address and row scanning, although not shown in the diagram. The horizontal scanner 12 and the vertical scanner 14 start selection operation (scanning) of the row and column in response to control signals CN1 and CN2 given from the communication-and-timing controller 20.

The communication-and-timing controller 20 includes a functional block of a timing generator (one example of a readout address control device) that supplies a clock synchronized with a master clock MCK input via a terminal 5a to the respective units in the device (scanners 12 and 14 and column AD conversion unit 26). Furthermore, the communication-and-timing controller 20 includes a functional block of a communication interface that receives the master clock MCK supplied from an external main controller via the terminal 5a and data supplied from the external main controller via a terminal 5b and directing the operating mode and so forth, and outputs data including information on the solid-state imaging device 1 to the external main controller.

The communication-and-timing controller 20 has a clock converter 20a as one example of a clock converter to generate the internal clock, and a system controller 20b having a communication function and a function to control the timings of the respective units. The clock converter 20a includes a multiplier circuit that generates a pulse whose frequency is higher than that of the master clock MCK based on the master clock MCK input from the terminal 5a, and generates the internal clocks such as an AD clock CKcnt and a DAC clock CKdac.

The output unit 28 has a signal amplifier 802 (S•A) and a digital interface unit 806 (DIF). The signal amplifier 802 detects a signal (having small amplitude although being digital data) on a horizontal signal line 18 as a signal line for data transfer (transfer line). The digital interface unit 806 intervenes between the signal amplifier 802 and an external circuit and has a function of the interface with the external circuit. The output of the digital interface unit 806 is connected to an output terminal 5c, and video data is output to the subsequent-stage circuit.

In the output unit 28, a digital calculation unit 804 to execute various kinds of digital calculation processing may be provided according to need between the signal amplifier 802 and the digital interface unit 806, as shown by the dashed line in the diagram. For example, the digital calculation unit 804 is used in the case of executing CDS processing after horizontally transferring P-phase and D-phase data separately from each other, and is used also in the case of executing addition/subtraction processing in the horizontal direction.

The unit pixel 3 is connected to the vertical scanner 14 via a row control line 15 for row selection, and to the AD converter 750 provided for each of the vertical columns in the column AD conversion unit 26 via the vertical signal line 19. The row control line 15 refers to the overall lines entering the pixels from the vertical scanner 14.

As the AD conversion system in the AD converter 750, various systems have been devised from the perspective of the circuit scale, the processing speed (speed enhancement), the resolution, etc. As one example, the AD conversion system referred to also as the reference signal comparison type, the slope integration type, or the ramp signal comparison type is employed. With this technique, the AD converter can be realized with a simple configuration and thus the circuit scale does not become large even when the AD converters are provided in parallel. In the AD conversion of the reference signal comparison type, a count operation valid period Ten (count enable signal EN indicating the period, in this configuration) is decided based on the time from the conversion start (comparison processing start) to the conversion end (comparison processing end), and the processing-subject signal is converted to digital data based on the number of clocks in the period.

As an idea in the case of employing the AD conversion system of the reference signal comparison type, it will also be possible that the reference signal generators 27 are also provided in parallel to the columns (for each pixel column). This corresponds to e.g. the case of employing a configuration in which a comparator and a reference signal generator are provided for each pixel column and the value of the reference signal is sequentially changed by the reference signal generator of the corresponding column based on the comparison result by the comparator of the same column. However, this configuration increases the circuit scale and the power consumption. Therefore, the present application example employs a configuration in which the reference signal generator 27 is used in common to all columns and the reference signal SLP_ADC generated from the reference signal generator 27 is shared by the AD converters 750 of the respective pixel columns.

For this purpose, the reference signal generator 27 has a DA converter 770 (digital analog converter (DAC)). The DA converter 770 synchronizes with the DAC clock CKdac from the initial value indicated by control data CN4 from the communication-and-timing controller 20 and generates the reference signal SLP_ADC with the slope (change rate) indicated by the control data CN4. Although description of the detailed configuration thereof is omitted, e.g. a configuration in which count output data of a counter circuit is utilized will be employed. The reference signal SLP_ADC may be any type as long as it has a waveform linearly changing with a certain slope as a whole. This change may be in a smooth slope manner, or may be in a sequential stepwise manner.

To carry out AD conversion of the reference signal comparison type, the AD converter 750 includes a comparator 752 (COMP), a count operation period controller 753 (EN generation), and a counter unit 754.

In the AD conversion of the reference signal comparison type, the count operation valid period Ten (signal indicating this period is the count enable signal EN) is decided based on the result of comparison between the reference signal SLP_ADC and the pixel signal voltage Vx by the comparator 752, and the analog processing-subject signal is converted to digital data based on the number of clocks of the AD clock CKcnt in the period during which the count enable signal EN is active.

Processing of the reference level (reset level Srst) will be referred to as the processing of the pre-charge phase (often abbreviated as the P-phase), and processing of the signal level Ssig will be referred to as the processing of the data phase (often abbreviated as the D-phase). If the D-phase processing is executed after the P-phase processing, the D-phase processing is processing about the signal level Ssig obtained by adding the signal component Vsig to the reset level Srst.

Regarding how to decide the count operation valid period Ten and whether to execute differential processing (CDS processing) in the AD converter 750, the present assignee has proposed various AD conversion systems of the reference signal comparison type. Basically these systems can also be employed in this solid-state imaging device 1.

In any processing example, the reference signal SLP_ADC is supplied to a voltage comparator, and an analog pixel signal input via the vertical signal line 19 is compared with the reference signal SLP_ADC. Upon the start of the count operation valid period Ten, count by the clock signal is started. Thereby, the number of clocks in the specified count operation valid period Ten is counted to thereby carry out AD conversion.

As the counter unit 754, a component capable of switching between the up-count mode and the down-count mode (up/down counter) is employed. Using an up/down counter can achieve frame rate enhancement without a circuit scale increase. Furthermore, in the present example, a data storage unit 756 including latches 757 (memory) for horizontal transfer is provided at the subsequent stage of the counter units 754 provided on a column-by-column basis.

The comparator 752 compares the reference signal SLP_ADC generated by the reference signal generator 27 and the analog pixel signal voltage Vx obtained from the unit pixel 3 on the selected row via the vertical signal line 19 (H1, H2, . . . , Hh). The comparator 752 inverts a comparison pulse Co (comparator output) when the reference signal SLP_ADC corresponds with the pixel signal voltage Vx.

A control signal CN5 is input from the communication-and-timing controller 20 to the counter units 754 of the respective AD converters 750. The control signal CN5 specifies other pieces of control information regarding whether the counter unit 754 executes the P-phase and D-phase count processing in the down-count mode or in the up-count mode, the setting of an initial value Dini in the P-phase count processing, reset processing, and so forth.

To one input terminal (+) of the comparator 752, the reference signal SLP_ADC generated by the reference signal generator 27 is input in common to the input terminals (+) of the other comparators 752. To the other input terminal (−), the vertical signal line 19 of the corresponding vertical column is connected and the pixel signal voltage Vx from the pixel array unit 10 is individually input.

To a clock terminal CK of the counter unit 754, the AD clock CKcnt is input from the communication-and-timing controller 20 in common to the clock terminals CK of the other counter units 754. If the data storage unit 756 is not provided, a control pulse is input to the counter unit 754 from the horizontal scanner 12 via a control line 12c. The counter unit 754 has a latch function to hold the count result and holds the counter value until an instruction by the control pulse from the control line 12c is input thereto.

The solid-state imaging device 1 of the present application example is configured as a so-called one-chip device (device provided on the same semiconductor substrate) obtained by integrally forming the respective elements of the drive controller 7, such as the horizontal scanner 12 and the vertical scanner 14, together with the pixel array unit 10 in a semiconductor region such as single-crystalline silicon by using a technique similar to a semiconductor integrated circuit manufacturing technique.

The solid-state imaging device 1 may have a form formed as one chip in which the respective units are integrally formed in a semiconductor region in this manner. Alternatively, although not shown in the diagram, in such a state as to include also an optical system such as a photographic lens, an optical low-pass filter, and an infrared cut filter in addition to various kinds of signal processors such as the pixel array unit 10, the drive controller 7, and the column AD conversion unit 26, the solid-state imaging device 1 may have a form of a module that is obtained by collectively packaging these components and has the imaging function.

On the output side of the individual AD converters 750, the outputs of the counter units 754 can be connected to the horizontal signal line 18 for example. Alternatively, as shown in the diagram, it is also possible to employ a configuration in which the data storage unit 756 as a memory device including latches to hold the count result held by the counter units 754 is provided at the subsequent stage of the counter units 754. The data storage unit 756 holds and stores count data output from the counter units 754 at a predetermined timing.

The horizontal scanner 12 has the function of a readout scanner to read out the count value held by the data storage unit 756 in parallel with execution of the assigned processing by the respective comparators 752 and the counter units 754 in the column AD conversion unit 26. The output of the data storage unit 756 is connected to the horizontal signal line 18. The horizontal signal line 18 has signal lines covering the bit width of the AD converter 750 or the double width thereof (e.g. in the case of complementary output), and is connected to the output unit 28 having the signal amplifier 802 corresponding to the respective output lines. Each of the counter unit 754, the data storage unit 756, and the horizontal signal line 18 employs a configuration capable of handling N bits.

As the digital interface unit 806, the timing generating circuits 100D to 100 G and 100I of the first to fourth and sixth embodiments can be employed in order to convert the parallel data horizontally transferred from the data storage unit 756 via the horizontal signal line 18 to serial data. Furthermore, the timing generating circuit 100H of the fifth embodiment can be employed as the counter unit 754 of the AD converter 750. In addition, the timing generating circuit 100H of the fifth embodiment can be employed also as the counter circuit included in the DA converter 770.

The above-described embodiments may be employed as each of the digital interface unit 806, the counter unit 754, and the counter circuit included in the DA converter 770. In this case, as the reference timing generator 110, the local timing reproducer 120, and so forth, the first to fourth and sixth embodiments and the fifth embodiment may be employed separately from each other. Alternatively, one of the first to fourth and sixth embodiments and the fifth embodiment may be employed and shared.

In the above description, the solid-state imaging device 1 is employed as one example of the electronic apparatus. However, the electronic apparatus to which the timing generating circuit 100 described for the first to sixth embodiments is applied is not limited to an apparatus in a specific field as long as the apparatus has the function to process, at high speed, data of image, audio, etc. generated in the apparatus or input from the external. For example, the embodiments can be applied to various use purposes in which a multi-phase clock is used in a wireless device and so forth typified by a high-speed data link and an RF transceiver. In addition, it will be possible to employ the parallel-serial converters 320 and 370 described for the embodiments in the case in which high-speed data transfer is required in an audio reproduction device, a game machine, an electronic book, an electronic dictionary, etc.

The present application contains subject matter related to that disclosed in Japanese Priority Patent Application JP 2010-022725 filed in the Japan Patent Office on Feb. 4, 2010, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

The invention claimed is:

1. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a single phase clock signal, and the local timing circuit is configured to receive a control signal that controls a differential delay of respective components of the multi-phase timing signal with reference to the single phase clock signal, and
wherein the digital signal processing circuit receives the single phase clock signal and the multi-phase timing signal, and uses the single phase clock signal for low processing speed operations and the multi-phase timing signal for high processing speed operations.

2. The electronic circuit according to claim 1, wherein the reference timing signal comprises a phase locking pulse signal, and the local timing circuit is configured to receive a control signal that controls a differential delay of respective components of the multi-phase timing signal with reference to the phase locking pulse signal.

3. The electronic circuit according to claim 2, wherein the local timing circuit comprises a plurality of delay elements that receive the control signal and produce the differential delay of the respective components of the multi-phase timing signal.

4. The electronic circuit according to claim 3, wherein the reference timing circuit comprises a phase locked loop circuit.

5. The electronic circuit according to claim 4, wherein the phase locking pulse signal is a clock output of the phase locked loop circuit, the local timing circuit comprises a delay line that includes the plurality of delay elements, and the control signal is a voltage or current control signal that is based upon a voltage or current control signal of the phase locked loop circuit.

6. The electronic circuit according to claim 3, wherein the reference timing circuit comprises a delay locked loop circuit.

7. The electronic circuit according to claim 6, wherein the phase locking pulse signal is a clock output of the delay locked loop circuit, the local timing circuit comprises a delay line that includes the plurality of delay elements, and the control signal is a voltage or current control signal that is based upon a voltage or current control signal of the delay locked loop circuit.

8. The electronic circuit according to claim 6, wherein the phase locking pulse signal is a reference clock signal, the local timing circuit comprises a delay line that includes the plurality of delay elements, and the control signal is a voltage or current control signal that is based upon a voltage or current control signal of the delay locked loop circuit.

9. The electronic circuit according to claim 1,
wherein the local timing circuit is one of a plurality of local timing circuits respectively paired to a plurality of digital signal processing circuits, the plurality of local timing circuits each receiving the reference timing signal from the reference timing circuit, the plurality of local timing circuits each locally generating multi-phase timing signals for the respective plurality of digital signal processing circuits, and
for each of the plurality of digital signal processing circuits, the reference timing circuit is disposed further than the local timing circuit paired to the respective digital signal processing circuit from the respective digital signal processing circuit.

10. The electronic circuit according to claim 1,
wherein the local timing circuit is one of a plurality of local timing circuits paired to a plurality of digital signal processing circuits, the plurality of local timing circuits each receiving the reference timing signal from the reference timing circuit, the plurality of local timing circuits each locally generating respective multi-phase timing signals for the respective plurality of digital signal processing circuits based upon the reference timing signal received from the reference timing circuit, and
for each of the plurality of digital signal processing circuits, the reference timing circuit is disposed further than the local timing circuit paired to the respective digital signal processing circuit from the respective digital signal processing circuit.

11. The electronic circuit according to claim 1, wherein the local timing circuit is paired to a plurality of digital signal processing circuits, and generates the multi-phase timing signal locally for the plurality of digital signal processing circuits.

12. The electronic circuit according to claim 1, wherein the digital signal processing circuit comprises a counter that receives the multi-phase timing signal.

13. The electronic circuit according to claim 1, wherein the digital signal processing circuit comprises a parallel to serial converter that receives the multi-phase timing signal.

14. An electronic apparatus, comprising:
the electronic circuit of claim 1.

15. The electronic apparatus according to claim 14, wherein the electronic apparatus comprises a solid-state imaging device.

16. An electronic circuit, comprising:
a digital signal processing circuit;
a reference timing circuit that generates a reference timing signal;
a local timing circuit, locally connected to the digital signal processing circuit, configured to receive the reference timing signal, generate a multi-phase timing signal corresponding to the reference timing signal, and output the multi-phase timing signal to the digital signal processing circuit; and
an additional digital signal processing circuit,
wherein the reference timing circuit is disposed further than the local timing circuit from the digital signal processing circuit,
wherein the reference timing signal comprises a single phase clock signal, and the local timing circuit is configured to receive a control signal that controls a differential delay of respective components of the multi-phase timing signal with reference to the single phase clock signal, and
wherein the digital signal processing circuit receives the multi-phase timing signal, and the additional digital signal processing circuit receives the single phase signal, with the single phase signal being used by the additional digital signal processing circuit for low processing speed operations and the multi-phase timing signal being used by the digital signal processing circuit for high processing speed operations.

17. An electronic apparatus, comprising:
the electronic circuit of claim 16.

18. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a phase locking pulse signal, and the local timing circuit is configured to receive a control signal that controls a differential delay of respective components of the multi-phase timing signal with reference to the phase locking pulse signal,
wherein the local timing circuit comprises a plurality of delay elements that receive the control signal and produce the differential delay of the respective components of the multi-phase timing signal, and wherein the plurality of delay elements match delay elements of the reference timing circuit from which the control signal is received.

19. An electronic apparatus, comprising:
the electronic circuit of claim 18.

20. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a phase locking pulse signal, and the local timing circuit is configured to receive a control signal that controls a differential delay of respective components of the multi-phase timing signal with reference to the phase locking pulse signal,
wherein the local timing circuit comprises a plurality of delay elements that receive the control signal and produce the differential delay of the respective components of the multi-phase timing signal,
wherein the reference timing circuit comprises a phase locked loop circuit, and
wherein the phase locking pulse signal is a clock output of the phase locked loop circuit, the local timing circuit comprises a ring buffer that includes the plurality of delay elements, and the control signal is a voltage or current control signal that is based upon a voltage or current control signal of the phase locked loop circuit.

21. An electronic apparatus, comprising:
the electronic circuit of claim 20.

22. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a phase locking pulse signal, and the local timing circuit is configured to receive a control signal that controls a differential delay of respective components of the multi-phase timing signal with reference to the phase locking pulse signal,
wherein the local timing circuit comprises a plurality of delay elements that receive the control signal and produce the differential delay of the respective components of the multi-phase timing signal,
wherein the reference timing circuit comprises a phase locked loop circuit, and
wherein the phase locking pulse signal is a reference clock signal, the local timing circuit comprises a ring buffer that includes the plurality of delay elements, and the control signal is a voltage or current control signal that is based upon a voltage or current control signal of the phase locked loop circuit.

23. An electronic apparatus, comprising:
the electronic circuit of claim 22.

24. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a phase locking pulse signal, and the local timing circuit is configured to receive a control signal that controls a differential delay of respective components of the multi-phase timing signal with reference to the phase locking pulse signal,
wherein the local timing circuit comprises a plurality of delay elements that receive the control signal and produce the differential delay of the respective components of the multi-phase timing signal,
wherein the reference timing circuit comprises a phase locked loop circuit, and
wherein the phase locking pulse signal is a clock output of the phase locked loop circuit, the local timing circuit comprises a ring buffer that includes the plurality of delay elements, the control signal is a voltage or current control signal that is based upon a voltage or current control signal of the phase locked loop circuit, and the digital signal processing circuit comprises a counter that receives the multi-phase timing signal.

25. An electronic apparatus, comprising:
the electronic circuit of claim 24.

26. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a phase locking pulse signal, and the local timing circuit is configured to receive a control signal that controls a differential delay of respective components of the multi-phase timing signal with reference to the phase locking pulse signal,
wherein the local timing circuit comprises a plurality of delay elements that receive the control signal and produce the differential delay of the respective components of the multi-phase timing signal,
wherein the reference timing circuit comprises a delay locked loop circuit, and
wherein the phase locking pulse signal is a clock output of the delay locked loop circuit, the local timing circuit comprises a ring buffer that includes the plurality of delay elements, and the control signal is a voltage or current control signal that is based upon a voltage or current control signal of the delay locked loop circuit.

27. An electronic apparatus, comprising:
the electronic circuit of claim 26.

28. An electronic circuit, comprising:
a digital signal processing circuit;
a reference timing circuit that generates a reference timing signal; and
a local timing circuit, locally connected to the digital signal processing circuit, configured to receive the reference timing signal, generate a multi-phase timing signal corresponding to the reference timing signal, and output the multi-phase timing signal to the digital signal processing circuit,
wherein the reference timing circuit is disposed further than the local timing circuit from the digital signal processing circuit,
wherein the reference timing signal comprises a phase locking pulse signal, and the local timing circuit is configured to receive a control signal that controls a differential delay of respective components of the multi-phase timing signal with reference to the phase locking pulse signal,
wherein the local timing circuit comprises a plurality of delay elements that receive the control signal and produce the differential delay of the respective components of the multi-phase timing signal,
wherein the reference timing circuit comprises a delay locked loop circuit, and
wherein the phase locking pulse signal is a reference clock signal, the local timing circuit comprises a ring buffer that includes the plurality of delay elements, and the control signal is a voltage or current control signal that is based upon a voltage or current control signal of the delay locked loop circuit.

29. An electronic apparatus, comprising:
the electronic circuit of claim 28.

* * * * *